(12) United States Patent  
Nishizawa

(10) Patent No.: US 11,563,049 B2  
(45) Date of Patent: Jan. 24, 2023

(54) SOLID-STATE IMAGING APPARATUS, METHOD FOR MANUFACTURING SOLID-STATE IMAGING APPARATUS, AND ELECTRONIC EQUIPMENT EQUIPPED WITH SOLID-STATE IMAGING APPARATUS

(71) Applicant: SONY SEMICONDUCTOR SOLUTIONS CORPORATION, Kanagawa (JP)

(72) Inventor: Kenichi Nishizawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 221 days.

(21) Appl. No.: 17/040,520

(22) PCT Filed: Mar. 5, 2019

(86) PCT No.: PCT/JP2019/008487  
§ 371 (c)(1),  
(2) Date: Sep. 22, 2020

(87) PCT Pub. No.: WO2019/188026  
PCT Pub. Date: Oct. 3, 2019

(65) Prior Publication Data  
US 2021/0005659 A1 Jan. 7, 2021

(30) Foreign Application Priority Data  
Mar. 30, 2018 (JP) .............................. JP2018-067796

(51) Int. Cl.  
*H01L 27/146* (2006.01)  
*H01L 25/16* (2006.01)

(52) U.S. Cl.  
CPC ...... *H01L 27/14634* (2013.01); *H01L 25/162* (2013.01); *H01L 25/167* (2013.01);  
(Continued)

(58) Field of Classification Search  
CPC ......... H01L 27/14634; H01L 27/14609; H01L 27/1469; H01L 25/162; H01L 25/167  
See application file for complete search history.

(56) References Cited

U.S. PATENT DOCUMENTS

| 2010/0276572 A1 | 11/2010 | Iwabuchi et al. |
| 2014/0138520 A1 | 5/2014 | Liu et al. |

(Continued)

FOREIGN PATENT DOCUMENTS

| JP | 2004-335533 A | 11/2004 |
| JP | 2013-077678 A | 4/2013 |

(Continued)

OTHER PUBLICATIONS

International Search Report and Written Opinion of PCT Application No. PCT/JP2019/008487, dated May 28, 2019, 13 pages of ISRWO.

*Primary Examiner* — Tucker J Wright  
(74) *Attorney, Agent, or Firm* — Chip Law Group

(57) ABSTRACT

Provided are a solid-state imaging apparatus, a method for manufacturing a solid-state imaging apparatus, and an electronic apparatus equipped with a solid-state imaging apparatus that can reduce the size of a semiconductor chip in such a way that one semiconductor substrate having a logic circuit controls two sensors. Provided is a solid-state imaging apparatus including a first sensor, a first semiconductor substrate having a memory, a second semiconductor substrate having a logic circuit, and a second sensor, in which the first sensor, the first semiconductor substrate, the second semiconductor substrate, and the second sensor are arranged in this order.

15 Claims, 14 Drawing Sheets

(52) U.S. Cl.
CPC .... *H01L 27/1469* (2013.01); *H01L 27/14609* (2013.01); *H01L 27/14625* (2013.01); *H01L 27/14636* (2013.01)

(56) References Cited

U.S. PATENT DOCUMENTS

2014/0138521 A1\* 5/2014 Liu ...................... H04N 5/378
257/432
2015/0270307 A1 9/2015 Umebayashi et al.
2019/0053406 A1\* 2/2019 Tezuka ................. H04N 5/3577

FOREIGN PATENT DOCUMENTS

| JP | 2014-099582 A | 5/2014 |
| --- | --- | --- |
| JP | 2014-195112 A | 10/2014 |
| JP | 2018-117027 A | 7/2018 |
| WO | 2006/129762 A1 | 12/2006 |
| WO | 2014/061240 A1 | 4/2014 |
| WO | 2018/135261 A1 | 7/2018 |

\* cited by examiner

FIG. 8

SOLID-STATE IMAGING APPARATUS, METHOD FOR MANUFACTURING SOLID-STATE IMAGING APPARATUS, AND ELECTRONIC EQUIPMENT EQUIPPED WITH SOLID-STATE IMAGING APPARATUS

CROSS REFERENCE TO RELATED APPLICATIONS

This application is a U.S. National Phase of International Patent Application No. PCT/JP2019/008487 filed on Mar. 5, 2019, which claims priority benefit of Japanese Patent Application No. JP 2018-067796 filed in the Japan Patent Office on Mar. 30, 2018. Each of the above-referenced applications is hereby incorporated herein by reference in its entirety.

TECHNICAL FIELD

The present technology relates to a solid-state imaging apparatus, a method for manufacturing a solid-state imaging apparatus, and electronic equipment equipped with a solid-state imaging apparatus, and particularly to a technique of a solid-state imaging apparatus including a stack of two sensors.

BACKGROUND ART

In recent years, digital cameras have become more and more popular. Along with this, the demand for solid-state imaging apparatuses (image sensors), which are a central component of digital cameras, has been increasing more and more. For example, in solid-state imaging apparatuses such as complementary metal oxide semiconductor (CMOS) image sensors, a reduction in size and thickness of the solid-state imaging apparatus has been studied as digital cameras have higher functionality and more functions.

Here, for example, a semiconductor image sensor module in which a first semiconductor chip including a CMOS image sensor and a second semiconductor chip including an analog digital (A/D) converter array are stacked is proposed (see Patent Document 1).

Furthermore, for example, there is proposed an imaging element including a silicon substrate on which a photoelectric conversion element is formed and a wiring layer formed on a front surface side of the silicon substrate, in which the photoelectric conversion element photoelectrically converts light incident from the front surface side through the wiring layer and photoelectrically converts light incident from the back surface side of the silicon substrate without passing through the wiring layer (see Patent Document 2).

CITATION LIST

Patent Document

Patent Document 1: Japanese Patent Application Laid-Open No. 2014-195112
Patent Document 2: Japanese Patent Application Laid-Open No. 2013-77678

SUMMARY OF THE INVENTION

Problems to be Solved by the Invention

By the way, a semiconductor chip including a sensor includes a logic circuit that controls the sensor. Here, in a case where stacking two sensors on a semiconductor chip is considered, there is a concern that a logic circuit for controlling each sensor is required and the semiconductor chip to be mounted on a product becomes large.

Therefore, the present technology has been made in view of such a situation, and it is a main object to provide a solid-state imaging apparatus, a method for manufacturing a solid-state imaging apparatus, and an electronic apparatus equipped with a solid-state imaging apparatus that can reduce the size of a semiconductor chip in such a way that one semiconductor substrate having a logic circuit controls two sensors.

Solutions to Problems

As a result of earnest research to achieve the above-mentioned object, the present inventor has succeeded in reducing the size of a semiconductor chip and has arrived at completion of the present technology.

That is, the present technology provides, first, a solid-state imaging apparatus including a first sensor, a first semiconductor substrate having a memory, a second semiconductor substrate having a logic circuit, and a second sensor, in which the first sensor, the first semiconductor substrate, the second semiconductor substrate, and the second sensor are arranged in this order.

In the solid-state imaging apparatus according to the present technology, an electrode of a first wiring layer formed on a front surface side of the first semiconductor substrate and an electrode of a second wiring layer formed on a front surface side of the second semiconductor substrate may be bonded so as to face each other and may be electrically connected.

In the solid-state imaging apparatus according to the present technology, the second semiconductor substrate may be electrically connected to each of the first sensor and the second sensor.

In the solid-state imaging apparatus according to the present technology, the second semiconductor substrate may be connected to each of the first semiconductor substrate and the second sensor by a copper wiring.

In the solid-state imaging apparatus according to the present technology, the second semiconductor substrate may be connected to the first sensor by a through via penetrating the first semiconductor substrate.

In the solid-state imaging apparatus according to the present technology, the logic circuit may control data written onto the memory from the first sensor and the second sensor or data read from the memory.

In the solid-state imaging apparatus according to the present technology, the logic circuit may control a timing of writing data onto the memory from the first sensor and the second sensor or a timing of reading data from the memory.

In the solid-state imaging apparatus according to the present technology, the memory may include a DRAM.

In the solid-state imaging apparatus according to the present technology, the memory may include an SRAM.

In the solid-state imaging apparatus according to the present technology, the first sensor and the second sensor may include a color filter, an on-semiconductor chip lens, and a photoelectric conversion unit.

In the solid-state imaging apparatus according to the present technology, the color filter and the on-semiconductor chip lens may be provided on a back surface side of the photoelectric conversion unit.

The solid-state imaging apparatus according to the present technology may further include a flexible printed substrate; and a cover glass.

Furthermore, the present technology provides a method for manufacturing a solid-state imaging apparatus, the method including:

bonding a first electrode formed on one surface of a first semiconductor substrate having a memory and a second electrode formed on one surface of a second semiconductor substrate having a logic circuit such that the first electrode and the second electrode face each other;

after the bonding, stacking a second sensor on another surface not bonded to the second semiconductor substrate; and after stacking the second sensor, stacking a first sensor on another surface not bonded to the first semiconductor substrate.

Furthermore, the present technology provides a method for manufacturing a solid-state imaging apparatus, the method including:

stacking a first sensor on one surface of a first semiconductor substrate having a memory, stacking a second sensor on one surface of a second semiconductor substrate having a logic circuit; and after stacking the respective first sensor and the second sensor, bonding a first electrode formed on another surface not bonded to the first semiconductor substrate and a second electrode formed on another surface not bonded to the second semiconductor substrate such that the first electrode and the second electrode face each other.

Furthermore, the present technology provides electronic equipment including the solid-state imaging apparatus.

Effects of the Invention

According to the present technology, one semiconductor substrate having a logic circuit controls two sensors so that the semiconductor chip can be reduced in size. Note that effects of the present technology are not necessarily limited to the above-described effects, but may also be any of those described in the present technology.

BRIEF DESCRIPTION OF DRAWINGS

FIG. 8 is a cross-sectional view showing an example of a method for manufacturing the solid-state imaging apparatus of the third embodiment to which the present technology has been applied (Part 2).

MODE FOR CARRYING OUT THE INVENTION

Hereinafter, a preferred mode for carrying out the present technology will be described with reference to the drawings. Note that embodiments described below indicate an example of representative embodiments of the present technology, and they do not make the scope of the present technology to be understood narrowly.

Note that description will be presented in the following order.

1. Overview of the present technology
2. First embodiment (example 1 of solid-state imaging apparatus)
3. Second embodiment (example 2 of solid-state imaging apparatus)

4. Third embodiment (example 1 of method for manufacturing solid-state imaging apparatus)

5. Fourth embodiment (example 2 of method for manufacturing solid-state imaging apparatus)

6. Fifth embodiment regarding electronic apparatus

7. Usage example of solid-state imaging apparatus to which the present technology is applied 8. Application example to endoscopic surgery system 1. Overview of the Present Technology The present technology relates to a multilayer stack-type image sensor including a stack of two sensors, and relates to a solid-state imaging apparatus, a method for manufacturing the solid-state imaging apparatus, and an electronic apparatus equipped with the solid-state imaging apparatus. According to the present technology, one semiconductor substrate having a logic circuit controls two sensors so that the semiconductor chip can be reduced in size.

Specifically, it relates to complementary metal oxide semiconductor (CMOS) image sensor, for example, a semiconductor image sensor module is assumed. The semiconductor image sensor module includes a stack of a plurality of semiconductor chips.

Figure 15:
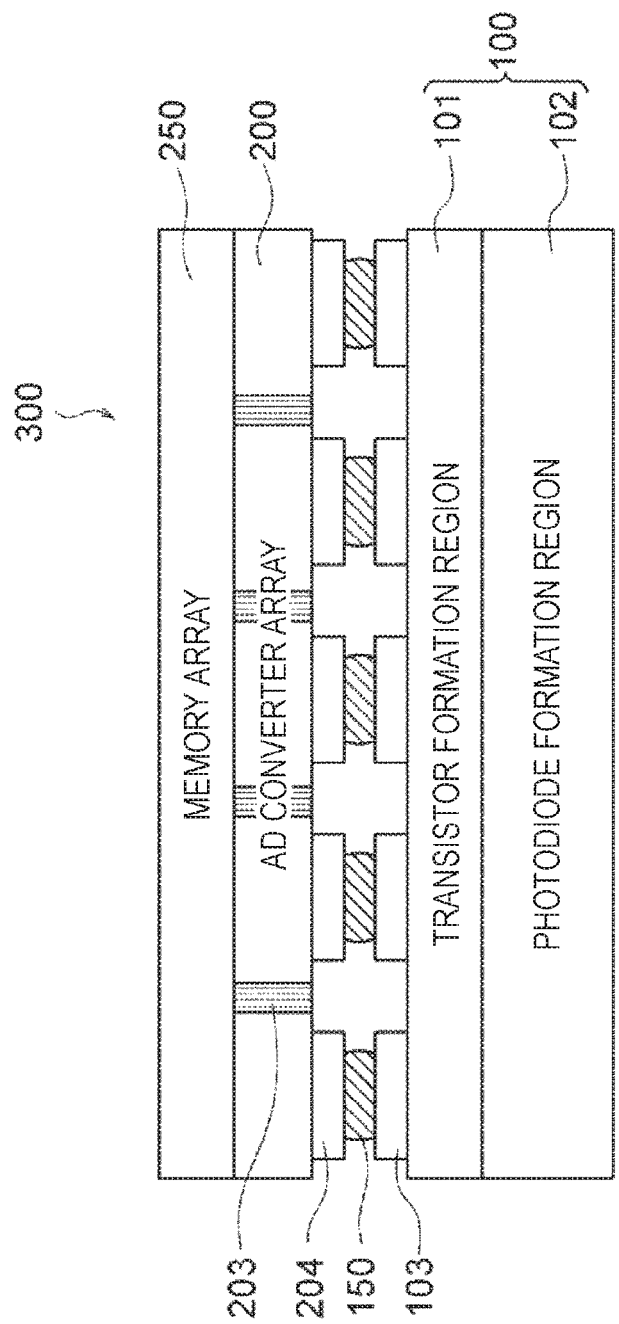
FIG. 15 is an explanatory diagram showing a configuration of an example of a semiconductor image sensor module including a stack of a first semiconductor chip, a second semiconductor chip, and a third semiconductor chip.

As shown in FIG. 15, a semiconductor image sensor module 300 includes a stack of a first semiconductor chip 100, a second semiconductor chip 200, and a third semiconductor chip 250.

The first semiconductor chip 100 includes a transistor formation region 101 constituting a unit pixel on the front surface side of the chip, and a photodiode formation region 102 in which a plurality of pixels is arranged regularly and photodiodes in which each pixel serves as a photoelectric conversion element are regularly arranged two-dimensionally.

The second semiconductor chip 200 includes an analog/digital converter array including a plurality of analog/digital converters. The second semiconductor chip 200 has through contacts 203.

The third semiconductor chip 250 includes a memory element array including a decoder and a sense amplifier. The third semiconductor chip 250 is electrically connected via the through contacts 203 of the second semiconductor chip 200.

The first semiconductor chip 100 includes pads 103. The second semiconductor chip 200 also includes pads 204. The first semiconductor chip 100 and the second semiconductor chip 200 are electrically connected via bumps 150 provided between the pads 103 and the pads 204.

Here, in the semiconductor image sensor module 300 shown in FIG. 15, since the first semiconductor chip 100 and the second semiconductor chip 200 are connected by the bumps 150, a connection region of the bumps 150 is necessary. Therefore, for example, in a case where a semiconductor chip having a stack of two sensors is considered, it is necessary to secure more connection regions corresponding to the bumps 150. Furthermore, in the case of such a semiconductor image sensor module 300, it has been necessary to provide a semiconductor substrate having a logic circuit for controlling the sensor for each sensor.

The present technology has been made in view of the above circumstances, and one semiconductor substrate having a logic circuit controls two sensors so that a semiconductor chip can be reduced in size, without addition of a semiconductor substrate having a logic circuit.

2. First Embodiment (Example 1 of Solid-State Imaging Apparatus)

[2-1. Structure of the Solid-State Imaging Apparatus According to the First Embodiment]

The solid-state imaging apparatus according to the first embodiment of the present technology includes a first sensor, a first semiconductor substrate having a memory, a second semiconductor substrate having a logic circuit, and a second sensor. Furthermore, the solid-state imaging apparatus includes the first sensor, the first semiconductor substrate, the second semiconductor substrate, and the second sensor arranged in this order.

With the solid-state imaging apparatus of the first embodiment according to the present technology, one semiconductor substrate having a logic circuit controls two sensors so that the semiconductor chip can be reduced in size.

Figure 1:
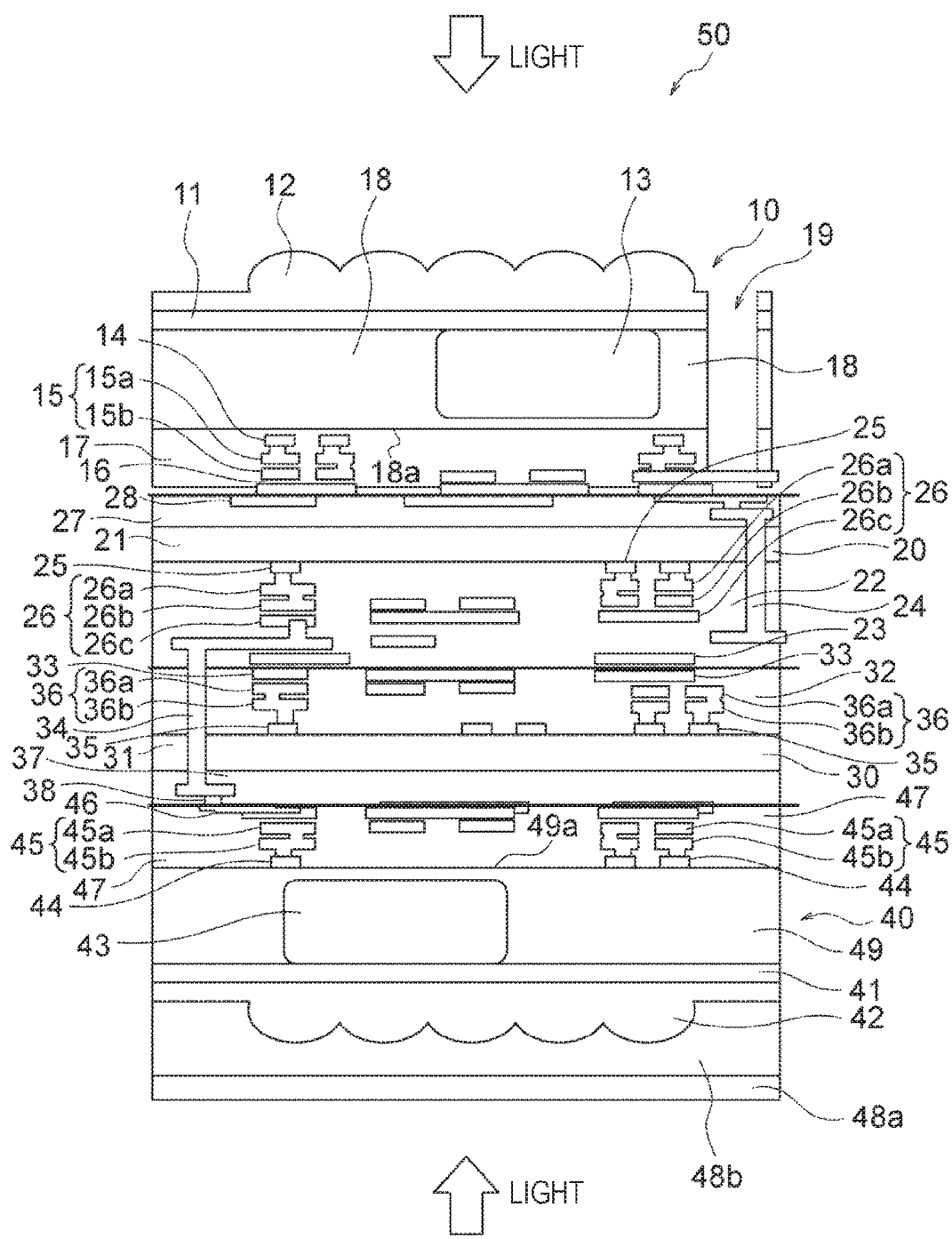
FIG. 1 is a cross-sectional view showing a configuration of a solid-state imaging apparatus according to a first embodiment to which the present technology has been applied.

FIG. 1 shows a solid-state imaging apparatus 50 that is an example of the solid-state imaging apparatus of the first embodiment according to the present technology. FIG. 1 is a cross-sectional view of the solid-state imaging apparatus 50. Note that, unless otherwise specified, "upper" means the upward direction in FIG. 1, and "lower" means the downward direction in FIG. 1.

The solid-state imaging apparatus 50 includes a first sensor 10, a first semiconductor substrate 20 having a memory 21, a second semiconductor substrate 30 having a logic circuit 31, and a second sensor 40. The solid-state imaging apparatus 50 includes the first sensor 10, the first semiconductor substrate 20, the second semiconductor substrate 30, and the second sensor 40 arranged in this order.

First, the configuration of the solid-state imaging apparatus 50 will be described according to the optical path of light incident on the first sensor 10. The first sensor 10 includes, in the order from the light incident side, a first on-semiconductor chip lens 12, a first color filter 11, and a first photoelectric conversion unit 13 including a photodiode. The first photoelectric conversion unit 13 is formed in a third semiconductor substrate 18. The first on-semiconductor chip lens 12 and the first color filter 11 are provided on the back surface side of the first photoelectric conversion unit 13.

A first sensor wiring layer 17 is formed on a front surface side 18a of the third semiconductor substrate 18. For the first sensor wiring layer 17, a copper (Cu) wiring formed by a dual damascene method is used, and a first via 14, a first wiring 15 (15a, 15b), and a conductive via 16 are formed. Furthermore, the first wiring 15 includes a first wiring 15a and a first wiring 15b. In this case, the first wiring 15 forms a multilayer wiring.

The first sensor wiring layer 17 of the first sensor 10 includes a circuit including a copper (Cu) wiring. The conductive via 16 connected to the first sensor wiring layer 17 is in close contact with the first semiconductor substrate 20, and is bonded, for example, by Cu—Cu bonding, to an electrode pad 28 formed on an oxide film 27 of the first semiconductor substrate 20. Here, Cu—Cu bonding is a bonding method in which two substrates to be bonded are heated and pressure is applied to each of the substrates to directly connect the copper (Cu) wirings of the substrates. Note that a member to be directly connected is not limited to copper (Cu), but may be silicon monoxide (Sio). Note that when connecting silicon monoxides directly to each other, it is called Sio-Sio connection.

In the first semiconductor substrate 20, a first wiring layer 22 is formed on the front surface side of the first semiconductor substrate 20. An electrode 23, a through via 24, a second via 25, and a second wiring 26 (26a, 26b, 26c) are formed in the first wiring layer 22. The through via 24 is formed so as to penetrate the first semiconductor substrate 20. Furthermore, for the through via 24, for example, an Al—Cu-based alloy is used. The second wiring 26 includes a second wiring 26a, a second wiring 26b, and a second wiring 26c. In this case, the second wiring 26 forms a multilayer wiring.

The electrode 23 of the first wiring layer 22 of the first semiconductor substrate 20 is bonded so as to face an electrode 33 of a second wiring layer 32 formed on the front surface side of the second semiconductor substrate 30, and is electrically connected. In this case, for example, the electrode 23 of the first semiconductor substrate 20 and the electrode 33 of the second semiconductor substrate 30 are bonded, for example, by Cu—Cu bonding.

Next, the configuration of the solid-state imaging apparatus 50 will be described according to the optical path of light incident on the second sensor 40. The second sensor 40 includes, in the order from the light incident side, glass 48a, a wafer support system 48b, a second on-semiconductor chip lens 42, a second color filter 41, and a second photoelectric conversion unit 43 including a photodiode. The second photoelectric conversion unit 43 is formed in a fourth semiconductor substrate 49. The second on-semiconductor chip lens 42 and the second color filter 41 are provided on the back surface side of the second photoelectric conversion unit 43.

Note that the wafer support system 48b is a recess-and-projection absorbing member for mounting the second on-semiconductor chip lens 42 on the second color filter 41. For example, the wafer support system 48b includes a highly heat-resistant material, and a transparent material whose shape reversibly changes by heat, such as polyethylene, polystyrene, acrylic resin, vinyl chloride, or the like is used therefor. Furthermore, a curable liquid adhesive may be used to protect the second on-semiconductor chip lens 42 as a wafer support system.

A fourth sensor wiring layer 47 is formed on a front surface side 49a of the fourth semiconductor substrate 49. For the fourth sensor wiring layer 47, a copper (Cu) wiring formed by a dual damascene method is used, and a fourth via 44, a fourth wiring 45 (45a, 45b), and a conductive via 46 are formed. Furthermore, the fourth wiring 45 includes a fourth wiring 45a and a fourth wiring 45b. In this case, the fourth wiring 45 forms a multilayer wiring.

The fourth sensor wiring layer 47 of the second sensor 40 includes a circuit including a copper (Cu) wiring. The conductive via 46 connected to the fourth sensor wiring layer 47 is in close contact with the second semiconductor substrate 30, and is bonded, for example, by Cu—Cu bonding, to an electrode pad 38 of the second semiconductor substrate 30.

In the second semiconductor substrate 30, a second wiring layer 32 is formed on the front surface side of the second semiconductor substrate 30. An electrode 33, a through via 34, a third via 35, and a third wiring 36 (36a, 36b, 36c) are formed in the second wiring layer 32. The through via 34 is formed so as to penetrate the second semiconductor substrate 30. Furthermore, for the through via 34, for example, an Al—Cu-based alloy is used. The third wiring 36 includes a third wiring 36a, a third wiring 36b, and a third wiring 36c. In this case, the third wiring 36 forms a multilayer wiring.

With such a configuration, in the solid-state imaging apparatus 50 of the first embodiment, the first sensor 10 receives light incident from the side opposite to the side where the first semiconductor substrate 20 is stacked, and the second sensor 40 receives light incident from the side opposite to the side where the second semiconductor substrate 30 is stacked. Therefore, the solid-state imaging apparatus 50 forms a double-sided sensor.

Note that the side of the surface where the first semiconductor substrate 20 and the second semiconductor substrate 30 are bonded together is the front surface side, and the opposite side is the back surface side. With such a configuration, in the solid-state imaging apparatus 50 of the first embodiment, the first sensor 10 and the second sensor 40 can form a back-illuminated image sensor.

As described above, in the solid-state imaging apparatus 50 of the first embodiment, the first sensor 10 and the first semiconductor substrate 20 are Cu—Cu bonded. Furthermore, in the solid-state imaging apparatus 50, the first semiconductor substrate 20 and the second semiconductor substrate 30 are Cu—Cu bonded. Moreover, the second semiconductor substrate 30 and the second sensor 40 are Cu—Cu bonded.

Therefore, the solid-state imaging apparatus 50 of the first embodiment does not need to secure the above-described bump connection region, and the thickness of the solid-state imaging apparatus 50 can be reduced. Accordingly, the solid-state imaging apparatus 50 of the first embodiment can be reduced in size by a reduction in volume.

Furthermore, since the first sensor 10, the first semiconductor substrate 20, and the second semiconductor substrate 30 are Cu—Cu bonded, the logic circuit 31 of the second semiconductor substrate 30 can independently control the respective first sensor 10 and the second sensor 40. That is, according to the present technology, the logic circuit 31 of the second semiconductor substrate 30 can integrally control the first sensor 10 and the second sensor 40. This control will be described with reference to FIG. 2.

[2-2. Connection Specification of the Solid-State Imaging Apparatus of the First Embodiment]

Figure 2:
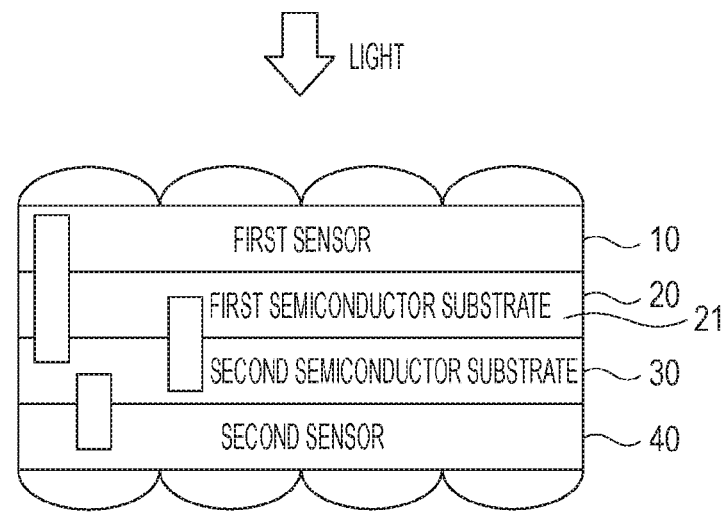
FIG. 2 is an explanatory diagram showing a cross-sectional configuration of connection specification of the solid-state imaging apparatus according to the first embodiment to which the present technology has been applied.

FIG. 2 shows connection specification of the solid-state imaging apparatus 50 according to the first embodiment. FIG. 2 is a cross-sectional view of connection specification of the solid-state imaging apparatus 50 of the first embodiment. Note that FIG. 2 conceptually describes the connection state described in FIG. 1 as connection specification.

As described with reference to FIG. 1, the second semiconductor substrate 30 is electrically connected by the through via 24 penetrating the first semiconductor substrate 20. Therefore, as shown in FIG. 2, the second semiconductor substrate 30 can be electrically directly connected to the first sensor 10. Furthermore, since the second semiconductor substrate 30 is Cu—Cu bonded to the conduction via 46 of the second sensor 40, the second semiconductor substrate 30 can be electrically directly connected to the second sensor 40.

Furthermore, the electrode 33 of the second wiring layer 32 of the second semiconductor substrate 30 is arranged so as to face the electrode 23 of the first wiring layer 22 of the first semiconductor substrate 20, and is Cu—Cu bonded. Therefore, the second semiconductor substrate 30 can be electrically directly connected to the first semiconductor substrate 20.

Therefore, the logic circuit 31 of the second semiconductor substrate 30 can directly control the first sensor 10, the first semiconductor substrate 20, and the second sensor 40, and the solid-state imaging apparatus 50 can be controlled integrally.

[2-3. Signal Processing of the Solid-State Imaging Apparatus of the First Embodiment]

The solid-state imaging apparatus 50 of the first embodiment has the memory 21 in the first semiconductor substrate 20. The memory 21 can include a dynamic random access memory (DRAM). Since the memory 21 includes a DRAM, the solid-state imaging apparatus 50 can convert a signal charge accumulated in the first sensor 10 or the second sensor 40 into an electric signal and store it in the DRAM of the memory 21 as an image signal.

In this case, the logic circuit 31 of the second semiconductor substrate 30 can control data (image signal) written onto the memory 21 from the first sensor 10 and the second sensor 40, or data (image signal) read from the memory 21. Furthermore, the logic circuit 31 of the second semiconductor substrate 30 can also control a timing of writing data (image signal) from the first sensor 10 and the second sensor 40 onto the memory 21, or a timing of reading data (image signal) from the memory 21.

Figure 3:
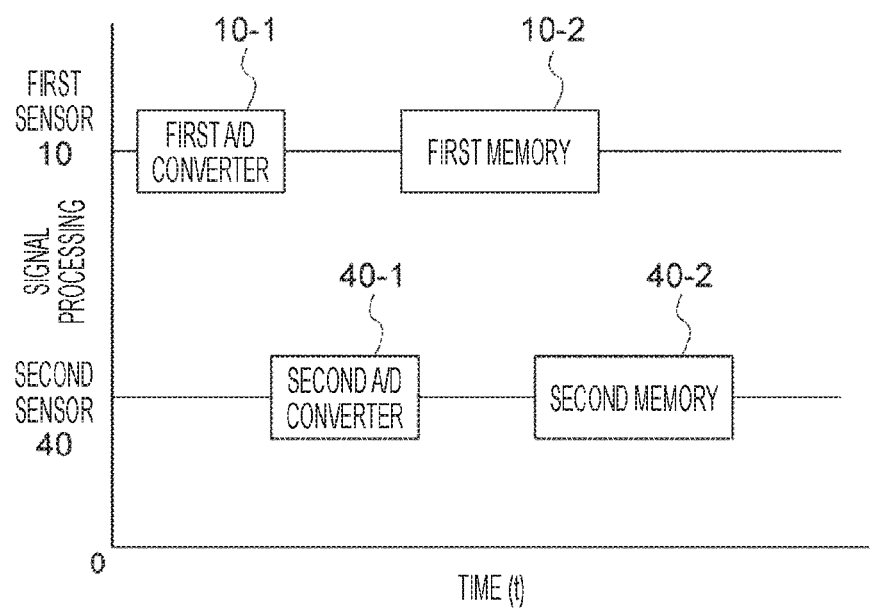
FIG. 3 is an explanatory diagram showing an example of a timing at which a logic circuit of a second semiconductor substrate controls a first sensor and a second sensor to perform exposure in the solid-state imaging apparatus of the first embodiment to which the present technology has been applied.

FIG. 3 shows an example in which the logic circuit 31 of the second semiconductor substrate 30 of the solid-state imaging apparatus 50 of the first embodiment controls the first sensor 10 and the second sensor 40. FIG. 3 is an explanatory diagram showing a timing at which the logic circuit 31 of the second semiconductor substrate 30 controls the first sensor 10 and the second sensor 40 to perform exposure.

For example, the logic circuit 31 of the second semiconductor substrate 30 of the solid-state imaging apparatus 50 controls the first sensor 10 and the second sensor 40 for a timing at which exposure starts in the first photoelectric conversion unit 13 and the second photoelectric conversion unit 43. As shown in FIG. 3, the logic circuit 31 controls, for example, the timing of starting the exposure of the first sensor 10 to start before the timing of starting the exposure of the second sensor 40.

In this case, the signal charge accumulated in the first photoelectric conversion unit 13 of the first sensor 10 on the basis of the exposure is converted into an electric signal by an A/D converter 10-1 formed in the first sensor wiring layer 17 of the first sensor 10. Then, the electric signal converted by the A/D converter 10-1 is stored as an image signal in a first memory 10-2 (memory 21) of the first semiconductor substrate 20 via the through via 24.

Furthermore, the signal charge accumulated in the second photoelectric conversion unit 43 of the second sensor 40 on the basis of the exposure is converted into an electric signal by an A/D converter 40-1 formed in the fourth sensor wiring layer 47 of the second sensor 40. Then, the electric signal converted by the A/D converter 40-1 is stored as an image signal in a second memory 40-2 (memory 21) of the first semiconductor substrate 20 via the through via 34.

In this way, the logic circuit 31 of the second semiconductor substrate 30 can control the timing of starting the exposure of the respective first sensor 10 and the second sensor 40, and therefore the first sensor 10 and the second sensor 40 can be controlled integrally.

Furthermore, the logic circuit 31 of the second semiconductor substrate 30 can control not only the timing of starting the exposure of the first sensor 10 and the second sensor 40, but also the timing of writing an image signal in the memory 21. For example, the logic circuit 31 controls the timing of writing the electric signal converted by the first A/D converter 40-1 onto the first memory 10-2 (memory 21) of the first semiconductor substrate 20 and the timing of writing the electric signal converted by the second A/D converter 40-1 onto the second memory 40-2 (memory 21) of the first semiconductor substrate 20.

Furthermore, the logic circuit 31 can also control the timing of reading an image signal from the first memory 10-2 (memory 21) and the timing of reading an image signal from the second memory 40-2 (memory 21).

Thus, the logic circuit 31 of the second semiconductor substrate 30 can control the timing of writing the image signal based on the signal charge from the first sensor 10 and the second sensor 40 onto the first memory 10-2 and the second memory 40-2 or the timing of reading the image signal based on the signal charge from the first memory 10-2 and the second memory 40-2.

Furthermore, the memory 21 is not limited to a DRAM, but can include a static random access memory (SRAM). Since the memory 21 includes an SRAM, the solid-state imaging apparatus 50 can store the image signal (electric signal) based on the signal charge accumulated in the first sensor 10 or the second sensor 40 in the SRAM of the memory 21. Furthermore, the image signal (electric signal) stored in the SRAM of the memory 21 is analyzed as image data after the solid-state imaging apparatus 50 is collected. Note that the solid-state imaging apparatus 50 can be reused after being collected.

3. Second Embodiment (Example 2 of the Solid-State Imaging Apparatus)

[3-1. Solid-state imaging apparatus according to the second embodiment]

FIGS. 4A, 4B, 5A, 5B, 6A, and 6B show a solid-state imaging apparatus according to the second embodiment. FIGS. 4A, 4B, 5A, 5B, 6A, and 6B are explanatory views showing a solid-state imaging apparatus 55 of the second embodiment. Note that FIGS. 4B, 5B, and 6B each show cross-sectional views of the solid-state imaging apparatus 55 of the second embodiment.

The solid-state imaging apparatus 55 of the second embodiment includes a flexible printed substrate 60 and a cover glass 70 in the solid-state imaging apparatus 50 of the first embodiment.

The flexible printed substrate 60 is a printed substrate having flexibility and connected to the solid-state imaging apparatus 50. The flexible printed substrate 60 supplies the image data captured by the solid-state imaging apparatus 50 to a display unit or external memory, which is not shown.

The cover glass 70 is a member that protects the solid-state imaging apparatus 50. The cover glass 70 is attached to one of both surfaces of the flexible printed substrate 60 to which the solid-state imaging apparatus 50 is not connected, i.e., the side of the solid-state imaging apparatus 50 where the glass 48a is not provided.

Figure 4A:
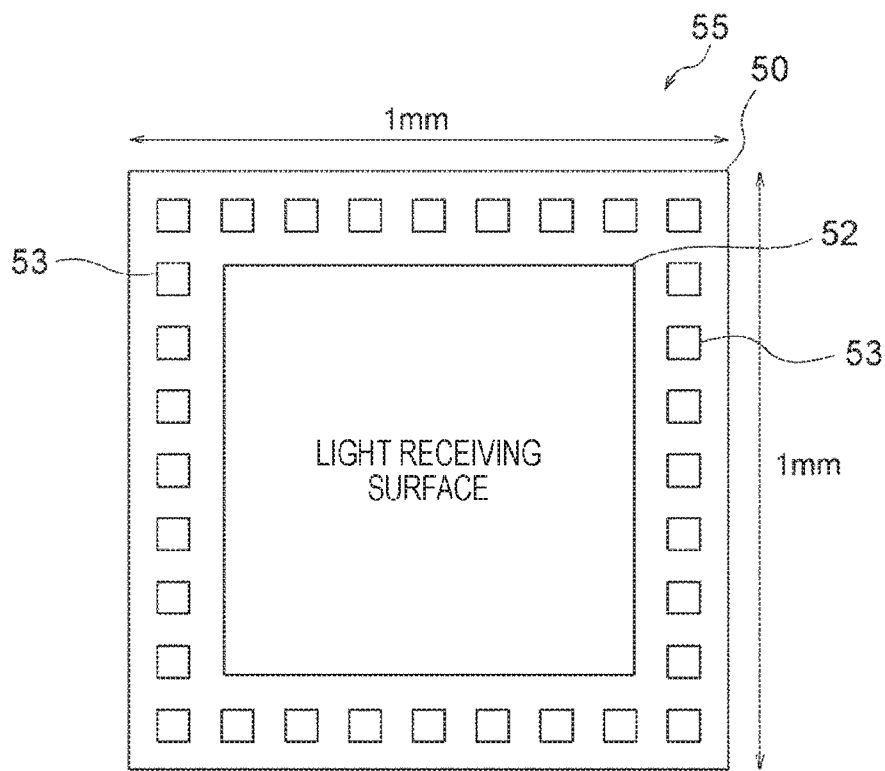
FIG. 4A is an example of a plan view of a solid-state imaging apparatus and a flexible substrate before soldering in a solid-state imaging apparatus of a second embodiment to which the present technology has been applied.
Figure 4B:
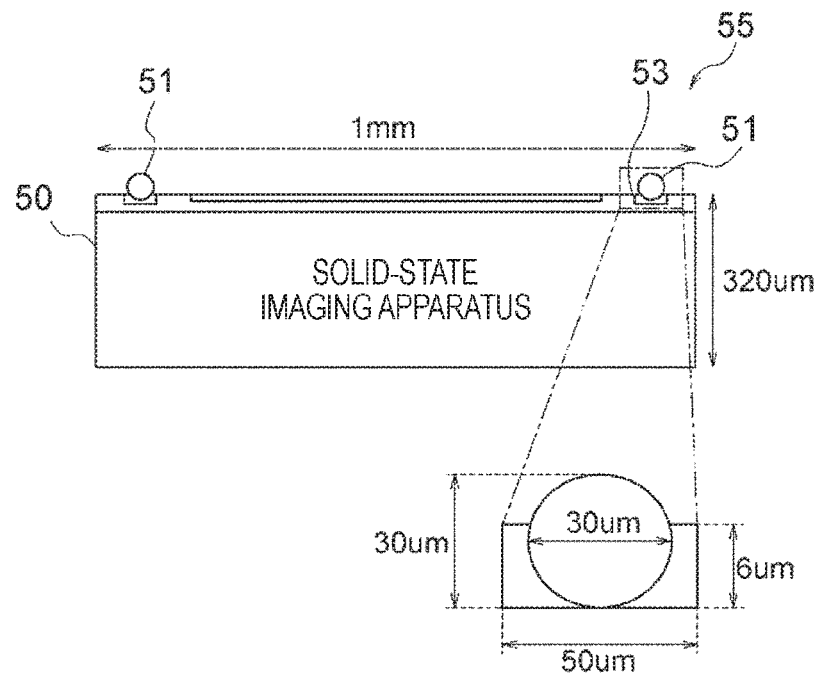
FIG. 4B is an example of a cross-sectional view of a solid-state imaging apparatus and a flexible substrate before soldering in the solid-state imaging apparatus of the second embodiment to which the present technology has been applied.

FIGS. 4A and 4B show an example of the solid-state imaging apparatus 55 before soldering according to the second embodiment of the present technology. FIG. 4A is an example of a plan view of the solid-state imaging apparatus 55 before soldering as viewed from above. FIG. 4B is an example of a cross-sectional view of the solid-state imaging apparatus 55 before soldering as viewed from the side.

As shown in FIG. 4A, in the solid-state imaging apparatus 55, a plurality of pads 53 having a rectangular shape for forming solder balls 51 is formed around a light receiving surface 52 having a rectangular shape. The size of one side of the solid-state imaging apparatus 55 when viewed from the above is, for example, 1 millimeter (mm).

As shown in FIG. 4B, the solder balls 51 are formed on the pad 53 portions of the solid-state imaging apparatus 55.

The diameter of the solder ball 51 is, for example, 30 micrometers (μm). Furthermore, the depth of the pad 53 is, for example, 6 micrometers (μm), and the length of one side of the pad 53 is, for example, 50 micrometers (μm). Furthermore, the thickness of the solid-state imaging apparatus 55 is, for example, 320 micrometers (μm). Then, the flexible printed substrate 60 is connected to the solid-state imaging apparatus 55.

For example, in the solid-state imaging apparatus 55, by arranging one end of the through via on only one surface thereof, the flexible printed substrate 60 can be connected to the one surface. Furthermore, the pad 53 can be provided on one surface of the solid-state imaging apparatus 55. Therefore, the solid-state imaging apparatus 55 can reduce the process cost as compared with the form in which the pads are arranged on both surfaces of the solid-state imaging apparatus 55.

Figure 5A:
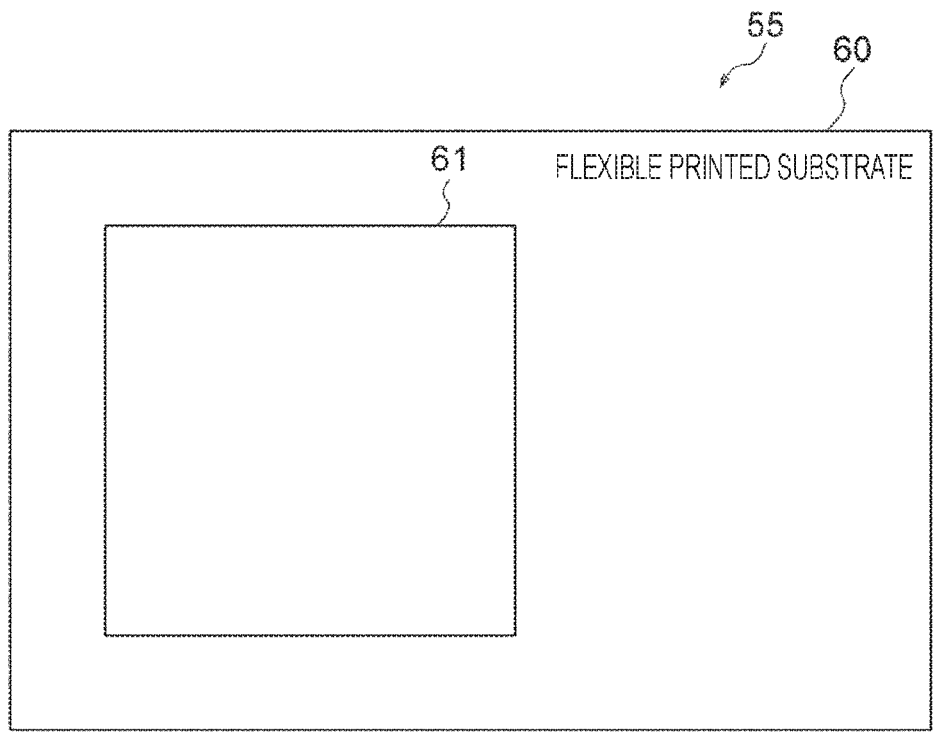
FIG. 5A is an example of a plan view of a solid-state imaging apparatus and a flexible substrate after soldering in the solid-state imaging apparatus of the second embodiment to which the present technology has been applied.
Figure 5B:
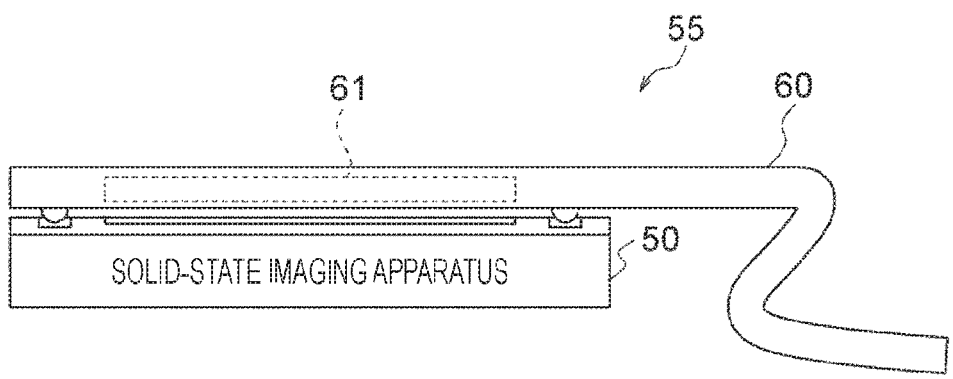
FIG. 5B is an example of a cross-sectional view of a solid-state imaging apparatus and a flexible substrate after soldering in the solid-state imaging apparatus of the second embodiment to which the present technology has been applied.

FIGS. 5A and 5B show an example of a plan view and a cross-sectional view of the solid-state imaging apparatus 55 and the flexible printed substrate 60 after soldering according to the second embodiment of the present technology. FIG. 5A is an example of a plan view of the solid-state imaging apparatus 55 and the flexible printed substrate 60 after soldering as viewed from above. FIG. 5B is an example of a cross-sectional view of the solid-state imaging apparatus 55 and the flexible printed substrate 60 after soldering as viewed from the side.

As shown in FIG. 5A, the flexible printed substrate 60 is provided with an opening 61 having substantially the same size as the light receiving surface 52. In the solid-state imaging apparatus 55, the flexible printed substrate 60 is soldered with the light receiving surface 52 aligned with the opening 61. Then, in the solid-state imaging apparatus 55, the cover glass 70 is attached to the flexible printed substrate 60 with an adhesive.

Figure 6A:
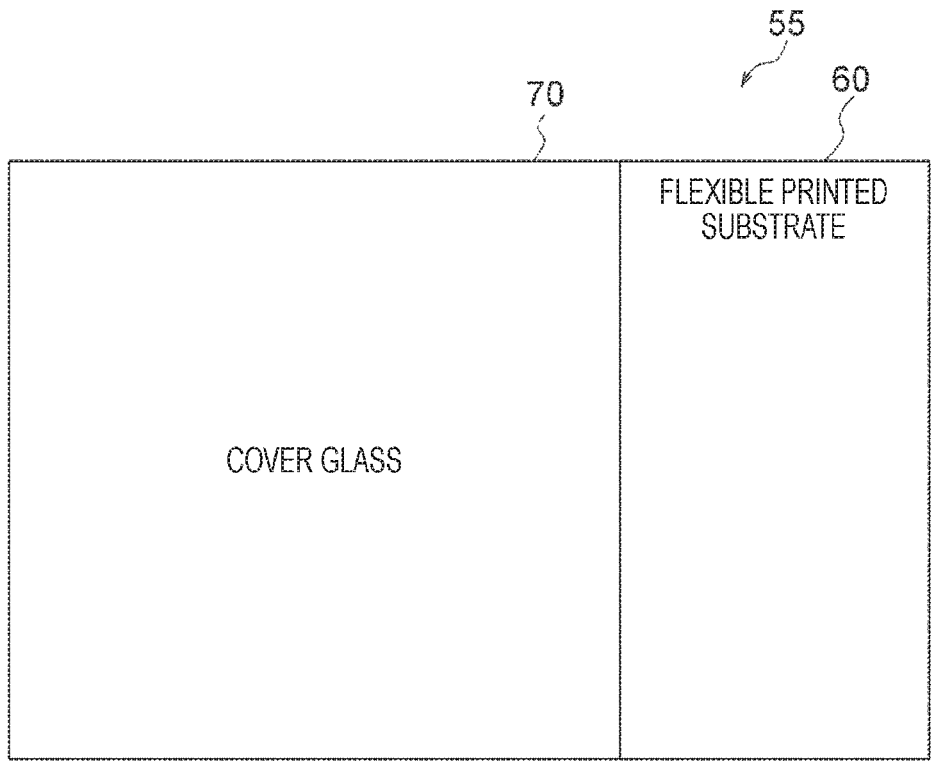
FIG. 6A is an example of a plan view of a solid-state imaging apparatus and a flexible substrate after a cover glass is attached in the solid-state imaging apparatus of the second embodiment to which the present technology has been applied.
Figure 6B:
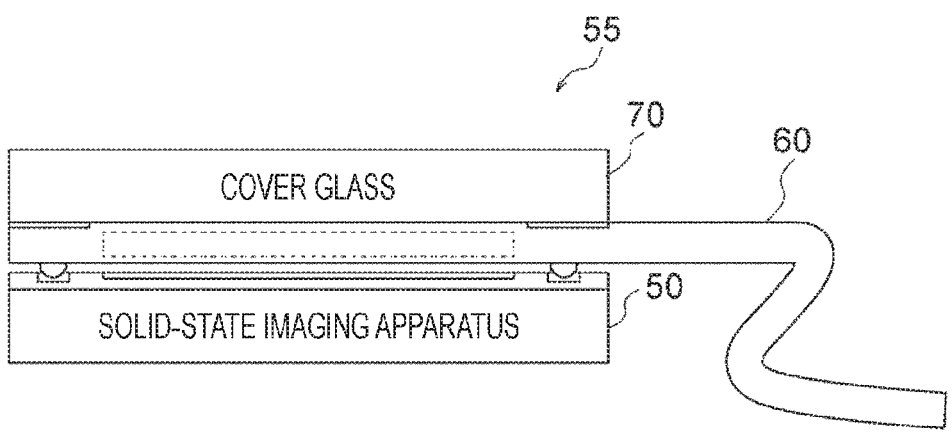
FIG. 6B is an example of a cross-sectional view of a solid-state imaging apparatus and a flexible substrate after a cover glass is attached in the solid-state imaging apparatus of the second embodiment to which the present technology has been applied.

FIGS. 6A and 6B show an example of a plan view and a cross-sectional view of the solid-state imaging apparatus 55 and the flexible printed substrate 60 after the cover glass 70 is attached according to the second embodiment of the present technology. FIG. 6A is an example of a plan view of the solid-state imaging apparatus 55 and the flexible printed substrate 60 after the cover glass 70 is attached as viewed from above. FIG. 6B is an example of a cross-sectional view of the solid-state imaging apparatus 55 and the flexible printed substrate 60 after the cover glass 70 is attached as viewed from the side.

Thus, the solid-state imaging apparatus 55 of the second embodiment can form a module structure with the flexible printed substrate 60 and the cover glass 70.

Therefore, the solid-state imaging apparatus 55 of the second embodiment can easily output image data (image signal) to, for example, external equipment (e.g., display unit, external memory, image processing circuit, or the like) connected to the outside, via the flexible printed substrate 60. Furthermore, the solid-state imaging apparatus 55 of the second embodiment can also be easily connected to external equipment by the flexible printed substrate 60.

4. Third Embodiment (Example 1 of Method for Manufacturing Solid-State Imaging Apparatus)

A method for manufacturing a solid-state imaging apparatus according to the third embodiment (example 1 of method for manufacturing the solid-state imaging apparatus) according to the present technology is a method for manufacturing a solid-state imaging apparatus, the method including: bonding a first electrode formed on one surface of a first semiconductor substrate having a memory and a second electrode formed on one surface of a second semiconductor substrate having a logic circuit such that the first electrode and the second electrode face each other; after the bonding, stacking a second sensor on the other surface not bonded to the second semiconductor substrate; and, after stacking the second sensor, stacking a first sensor on the other surface not bonded to the first semiconductor substrate.

FIGS. 7 to 10 show an example of a method for manufacturing the solid-state imaging apparatus 50 of the third embodiment. FIGS. 7 to 10 show an example of a method for manufacturing the solid-state imaging apparatus 50 according to the third embodiment. Note that, unless otherwise specified, "upper" means the upward direction in FIGS. 7 to 10, and "lower" means the downward direction in FIGS. 7 to 10. Note that FIGS. 7 to 10 show cross-sectional views of the solid-state imaging apparatus 50 according to the third embodiment.

The method for manufacturing the solid-state imaging apparatus 50 of the third embodiment is a manufacturing method in which the order of manufacturing the solid-state imaging apparatus 50 is such that the first semiconductor substrate 20 and the second semiconductor substrate 30 are attached and then the second sensor 40 and the first sensor 10 are stacked in order.

Figure 7:
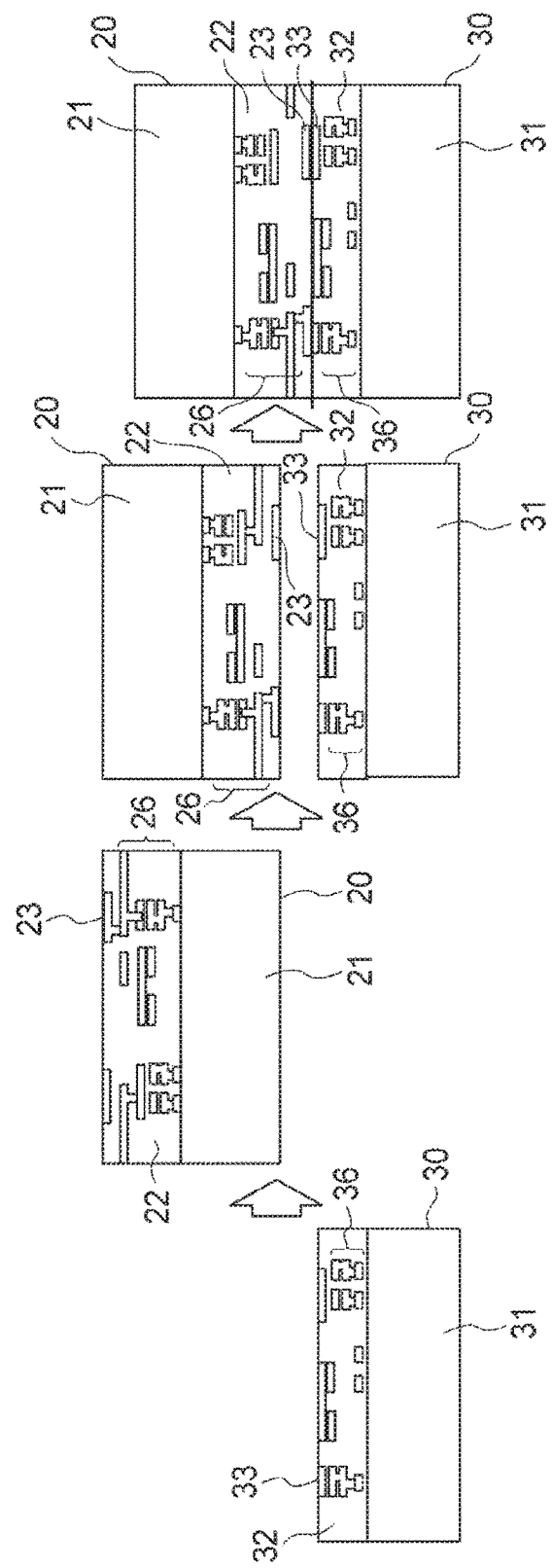
FIG. 7 is a cross-sectional view showing an example of a method for manufacturing a solid-state imaging apparatus of a third embodiment to which the present technology has been applied (Part 1).

FIG. 7 is an explanatory view showing processing of stacking the first semiconductor substrate 20 and the second semiconductor substrate 30. First, as shown in FIG. 7, in the second semiconductor substrate 30, the wiring 36 and the electrode 33 are formed with the second wiring layer 32 facing upward.

In the first semiconductor substrate 20, with the first wiring layer 22 facing upward, the uppermost aluminum (Al) of the second wiring 26 is processed, and then a Sio-based oxide film is formed. Then, in the first semiconductor substrate 20, a via is opened on the oxide film, and the electrode 23 is formed and contacts the second wiring 26 by a copper (Cu) wiring.

Next, the first semiconductor substrate 20 is inverted. Then, the inverted first semiconductor substrate 20 and the second semiconductor substrate 30 are arranged such that the electrode 23 of the first wiring layer 22 formed on the front surface side of the first semiconductor substrate 20 and the electrode 33 of the second wiring layer 32 formed on the front surface side of the second semiconductor substrate 30 face each other, and the electrode 23 and the electrode 33 are bonded and electrically connected. At this time, the electrode 33 of the second wiring layer 32 of the second semiconductor substrate 30 is bonded to the electrode 23 of the first wiring layer 22 of the first semiconductor substrate 20 by Cu—Cu bonding. Then, after bonded, the first semiconductor substrate 20 and the second semiconductor substrate 30 are inverted.

Figure 8:
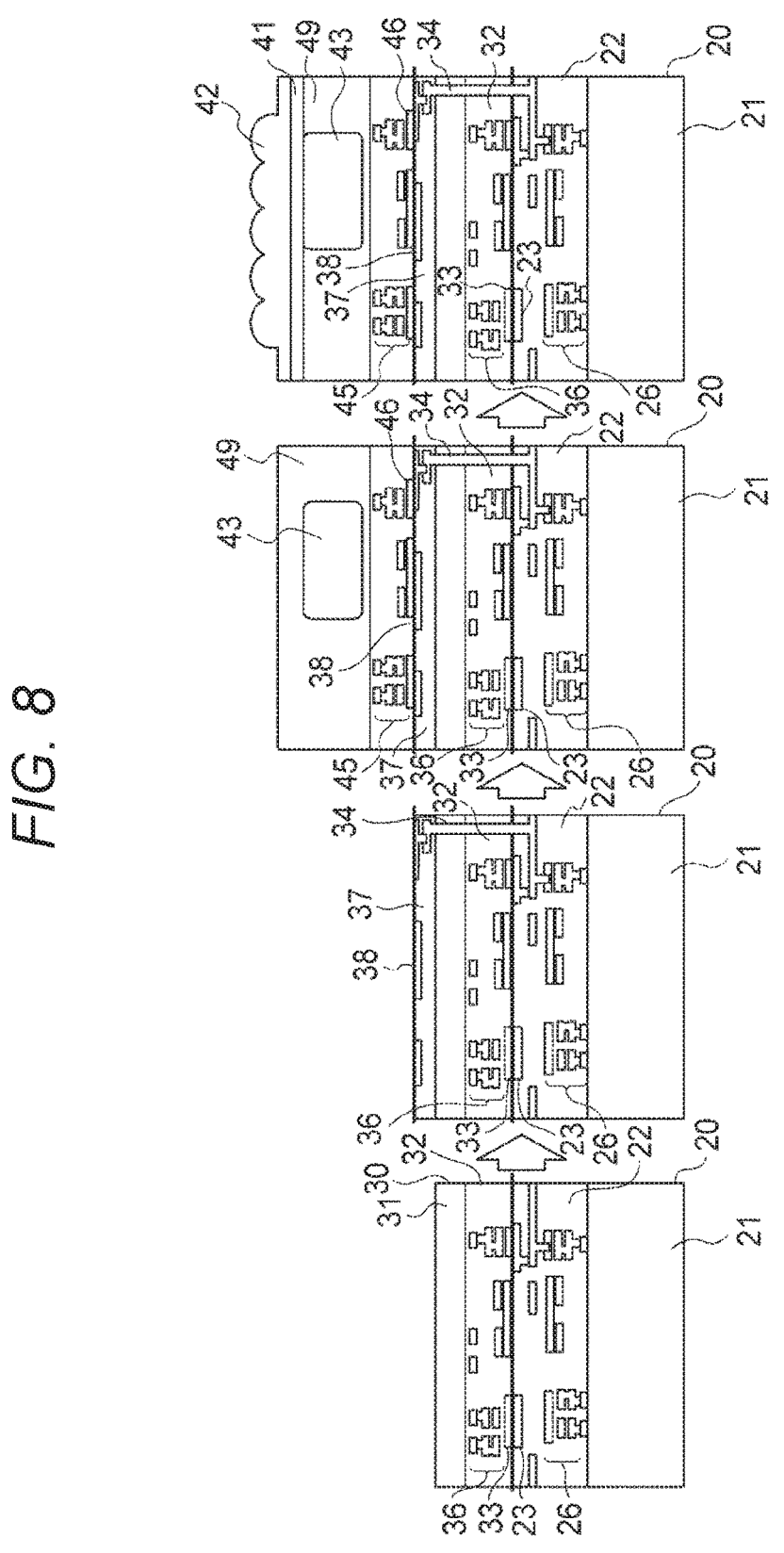

FIG. 8 is an explanatory diagram showing processing of stacking the second sensor 40 on the second semiconductor substrate 30. As shown in FIG. 8, as for the second semiconductor substrate 30, the silicon substrate on the back surface side is polished.

Then, the Sio-based oxide film 37 is formed on the polished portion of the second semiconductor substrate 30. In the second semiconductor substrate 30, the through via 34 is opened on the oxide film 37, and contacts a logic layer with Al—Cu-based alloy or the like. Copper (Cu) is stacked on the oxide film 37 for bonding with the second sensor 40. Then, the electrode pad 38 is formed by stacking copper (Cu).

Next, in the second semiconductor substrate 30, the fourth semiconductor substrate 49 having the second photoelectric conversion unit 43 is attached to the back surface side of the second semiconductor substrate 30.

Then, the fourth semiconductor substrate 49 is polished, and the second color filter 41 and the second on-semiconductor chip lens 42 are formed on the polished portion. Therefore, the second sensor 40 is formed.

Figure 9:
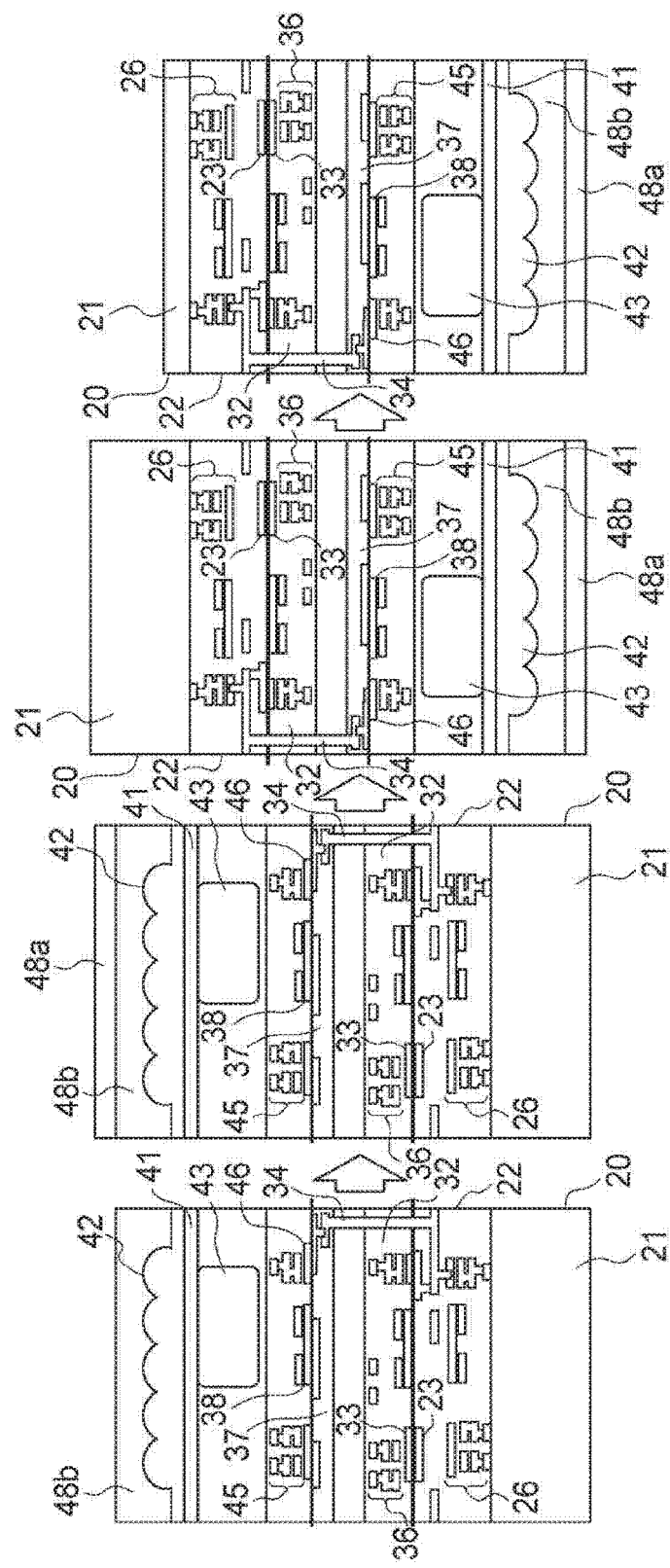
FIG. 9 is a cross-sectional view showing an example of a method for manufacturing the solid-state imaging apparatus of the third embodiment to which the present technology has been applied (Part 3).

FIG. 9 is an explanatory diagram showing processing of attaching the wafer support system 48b and polishing the first semiconductor substrate 20. As shown in FIG. 9, the second sensor 40 forms the wafer support system 48b on the second on-semiconductor chip lens 42.

In the wafer support system 48b, the glass 48a is attached onto the wafer support system 48b. The second sensor 40 can protect the second on-semiconductor chip lens 42 by attaching the glass 48a to the wafer support system 48b.

Next, the second semiconductor substrate 30 on which the second sensor 40 is stacked and the first semiconductor substrate 20 are inverted.

Then, as for the first semiconductor substrate 20, the silicon substrate on the back surface side is polished. At this time, it is polished to such an extent that the memory 21 of the first semiconductor substrate 20 is not damaged.

Figure 10:
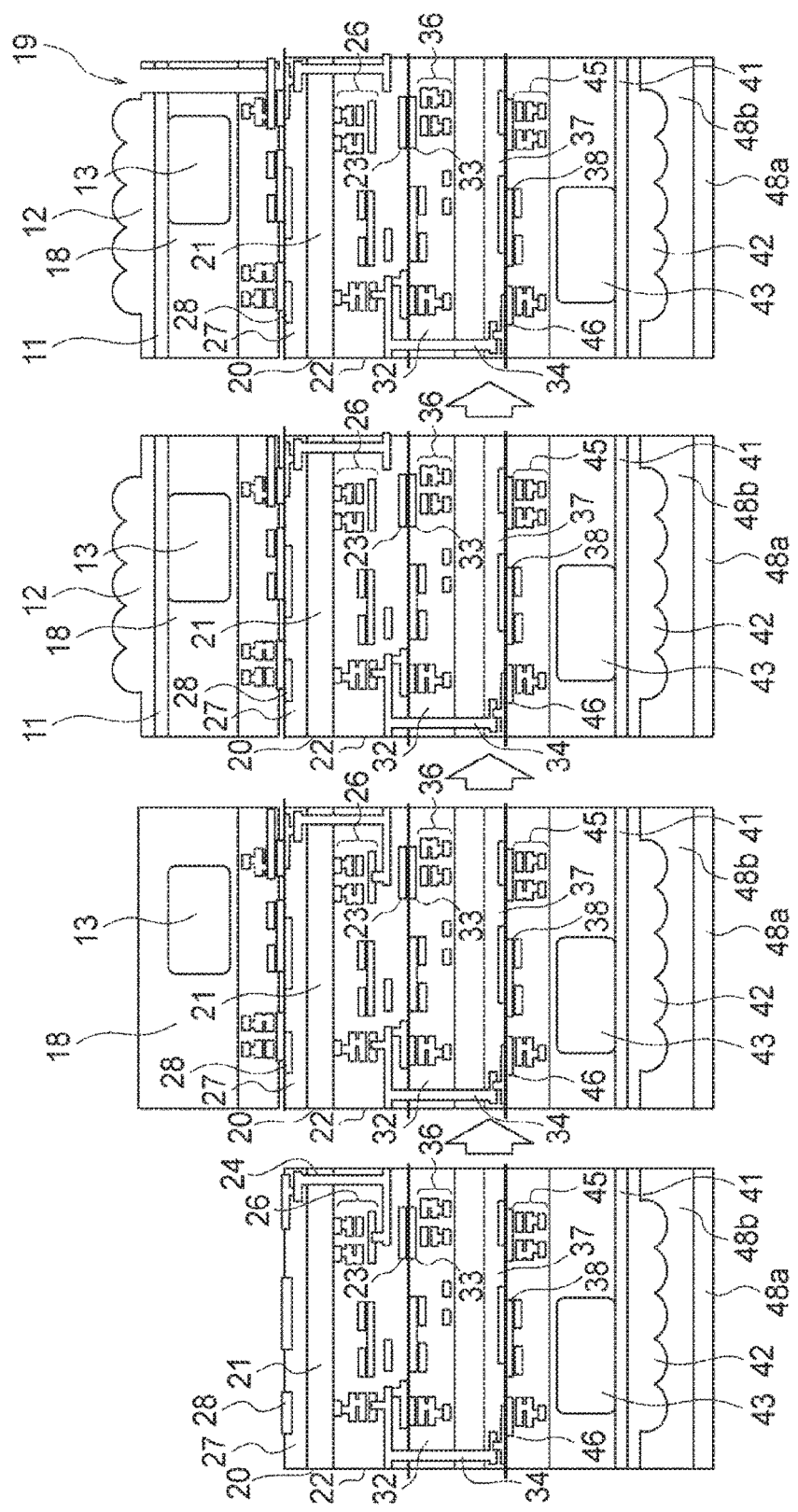
FIG. 10 is a cross-sectional view showing an example of a method for manufacturing the solid-state imaging apparatus of the third embodiment to which the present technology has been applied (Part 4).

FIG. 10 is an explanatory diagram showing processing of stacking the first color filter 11 forming the first sensor 10 and the first on-semiconductor chip lens 12 on the first semiconductor substrate 20.

As shown in FIG. 10, the first semiconductor substrate 20 has a polished back surface on which a Sio-based oxide film 27 is formed. Then, in the first semiconductor substrate 20, the through via 24 is opened on the oxide film 27 and contacts the logic layer with an Al—Cu-based alloy or the like. Copper (Cu) is stacked on the oxide film 27 for bonding with the first sensor 10. Then, the electrode pad 28 is formed by stacking copper (Cu).

Next, in the first semiconductor substrate 20, the third semiconductor substrate 18 having the first photoelectric conversion unit 13 is attached to the back surface side of the first semiconductor substrate 20.

Then, the third semiconductor substrate 18 is polished, and the first color filter 11 and the first on-semiconductor chip lens 12 are stacked on the polished portion. Therefore, the first sensor 10 is formed.

Finally, the first sensor 10 and the third semiconductor substrate 18 are opened in order to provide a pad 19 for outputting an electric signal of the first sensor 10.

In this way, the solid-state imaging apparatus 50 of the first embodiment can be manufactured by Example 1 of the method for manufacturing the solid-state imaging apparatus of the third embodiment.

5. Fourth Embodiment (Example 2 of Method for Manufacturing Solid-State Imaging Apparatus)

A method for manufacturing a solid-state imaging apparatus according to the fourth embodiment (example 2 of a method for manufacturing a solid-state imaging apparatus) according to the present technology is a method for manufacturing a solid-state imaging apparatus, the method including stacking a first sensor on one surface of a first semiconductor substrate having a memory, stacking a second sensor on one surface of a second semiconductor substrate having a logic circuit; and after stacking the respective first sensor and the second sensor, bonding a first electrode formed on the other surface not bonded to the first semiconductor substrate and a second electrode formed on the other surface not bonded to the second semiconductor substrate such that the first electrode and the second electrode face each other.

The method for manufacturing the solid-state imaging apparatus of the fourth embodiment is different from the method for manufacturing the solid-state imaging apparatus of the third embodiment in terms of processing of conducting each of the processing of stacking the first sensor 10 on the first semiconductor substrate 20 and the processing of stacking the second sensor 40 on the second semiconductor substrate 30. Then, finally, there is a manufacturing method in which the first semiconductor substrate 20 and the second semiconductor substrate 30 are attached together. The same points as those of the third embodiment are designated by the same reference numerals and the description thereof will be omitted.

Figure 11:
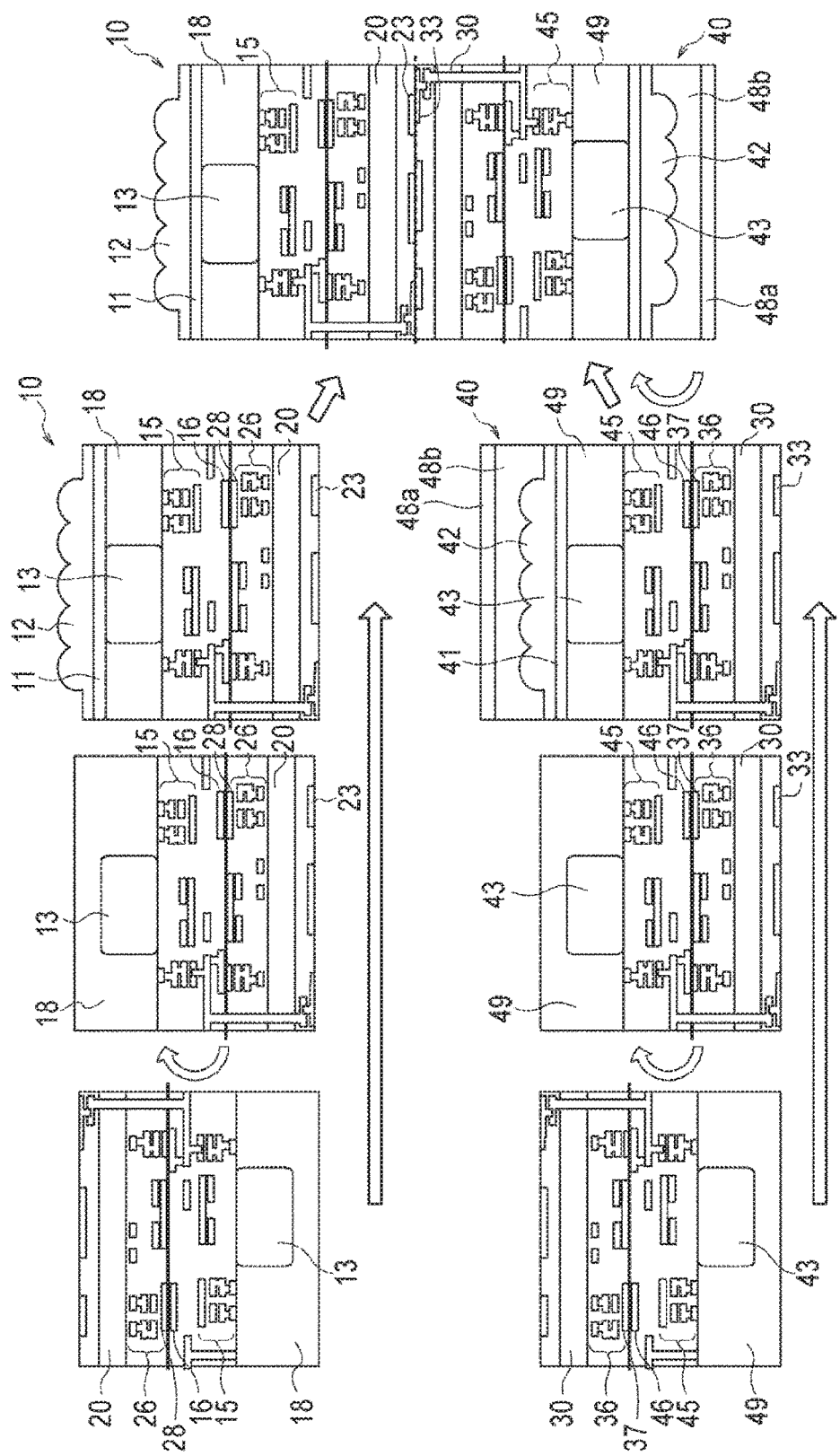
FIG. 11 is a cross-sectional view showing an example of a method for manufacturing a solid-state imaging apparatus of a fourth embodiment to which the present technology has been applied.

FIG. 11 shows an example of a method for manufacturing the solid-state imaging apparatus 50 of the fourth embodiment. FIG. 11 shows an example of a method for manufacturing the solid-state imaging apparatus 50 of the fourth embodiment. Note that, unless otherwise specified, "upper" means the upward direction in FIG. 11, and "lower" means the downward direction in FIG. 11. Note that FIG. 11 shows a cross-sectional view of the solid-state imaging apparatus 50 according to the fourth embodiment.

In FIG. 11, the processing of stacking the first sensor 10 on the first semiconductor substrate 20 is described from the upper left to the right in FIG. 11.

First, in the fourth embodiment, the third semiconductor substrate 18 having the first photoelectric conversion unit 13 is arranged on the lower side, and the first semiconductor substrate 20 is attached thereon. The third semiconductor substrate 18 and first semiconductor substrate 20, which are attached, are inverted, such that the third semiconductor substrate 18 is arranged on the upper side. Then, the first color filter 11 and the first on-semiconductor chip lens 12 are formed on the upper side of the first photoelectric conversion unit 13 of the third semiconductor substrate 18. Therefore, the first sensor 10 is stacked on the first semiconductor substrate 20.

Meanwhile, the processing of stacking the second sensor 40 on the second semiconductor substrate 30 is described from the lower left to the right in FIG. 11.

In the fourth embodiment, in parallel with the above, the fourth semiconductor substrate 49 having the second photoelectric conversion unit 43 is arranged on the lower side, and the second semiconductor substrate 30 is attached thereon. The fourth semiconductor substrate 49 and second semiconductor substrate 30, which are attached, are inverted, such that the fourth semiconductor substrate 49 is arranged on the upper side. Then, the second color filter 41, the second on-semiconductor chip lens 42, the wafer support system 48b, and the glass 48a are formed on the upper side of the second photoelectric conversion unit 43 of the fourth semiconductor substrate 49. Therefore, the second sensor 40 is stacked on the second semiconductor substrate 30.

After forming the glass 48a on the second sensor 40, the second semiconductor substrate 30 and the second sensor 40 are inverted, and the first semiconductor substrate 20 on which the first sensor 10 is stacked and the second semiconductor substrate 30 on which the second sensor 40 is stacked are attached.

In this way, the solid-state imaging apparatus 50 of the first embodiment can be manufactured by Example 2 of the method for manufacturing the solid-state imaging apparatus of the fourth embodiment.

6. Fifth Embodiment Regarding Electronic Apparatus

Electronic equipment according to the fifth embodiment of the present technology is electronic equipment equipped with a solid-state imaging apparatus including a first sensor, a first semiconductor substrate having a memory, a second semiconductor substrate having a logic circuit, and a second sensor, in which the first sensor, the first semiconductor substrate, the second semiconductor substrate, and the second sensor are arranged in this order. Furthermore, the electronic equipment of the fifth embodiment according to the present technology may be electronic equipment equipped with the solid-state imaging apparatus of the first or second embodiment of the present technology.

Figure 12:
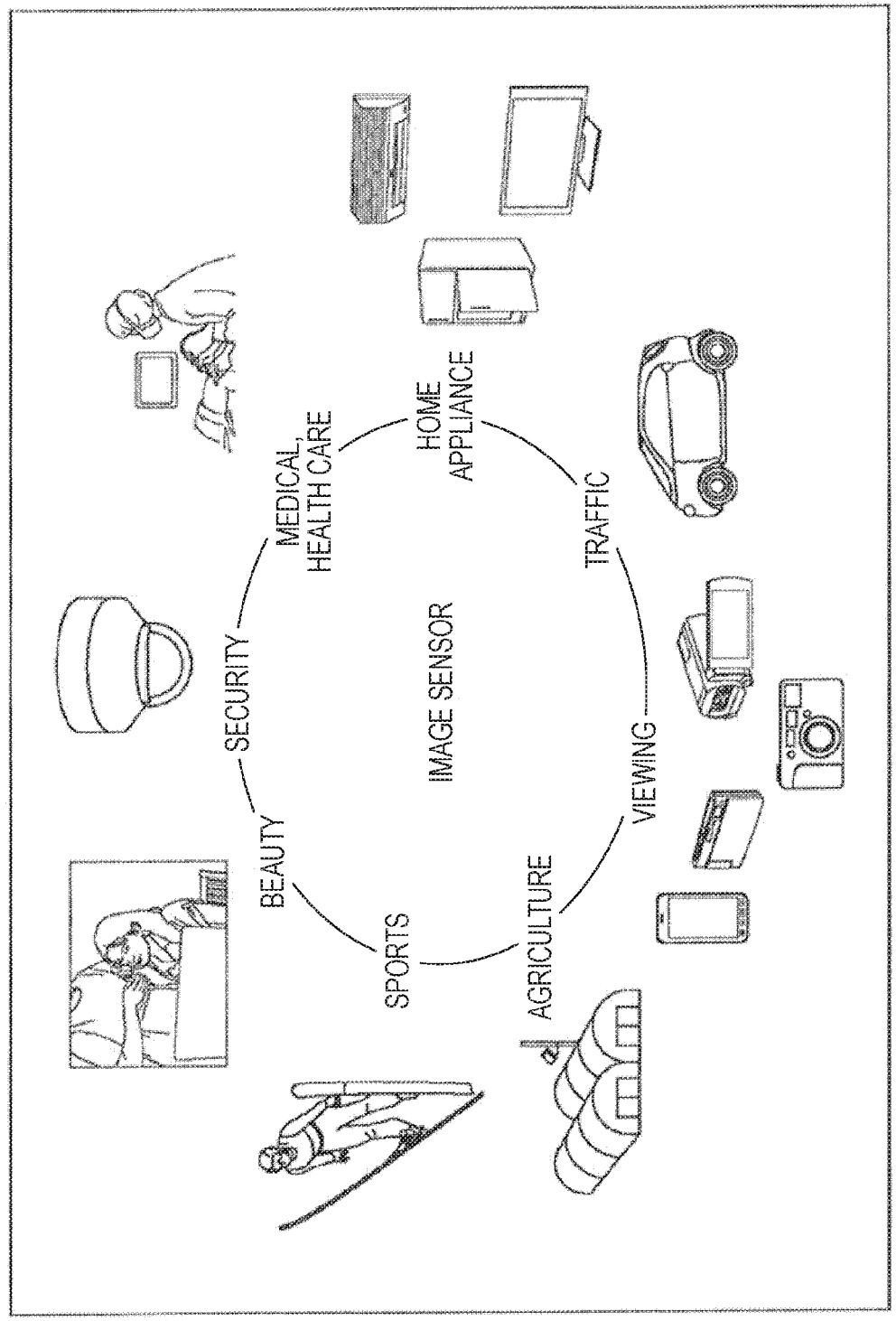
FIG. 12 is a diagram showing a usage example of the solid-state imaging apparatus of the first or second embodiment to which the present technology has been applied.

7. Usage Example of Solid-State Imaging Apparatus to which the Present Technology is Applied FIG. 12 is a diagram showing a usage example of the solid-state imaging apparatus 50 (55) of the first or second embodiment according to the present technology as an image sensor.

The solid-state imaging apparatus 50 (55) of the first or second embodiment described above can be used, for example, in various cases for sensing light such as visible light, infrared light, ultraviolet light, or X-ray, as will be described below. That is, as illustrated in FIG. 12, the solid-state imaging apparatus 50 (55) of the first or second embodiment can be used for an apparatus (e.g., the electronic apparatus of the fifth embodiment described above) used, for example, in a field of viewing in which images to be viewed are captured, a field of traffic, a field of home appliance, a field of medical and healthcare, a field of security, a field of beauty, a field of sports, a field of agriculture, or the like.

Specifically, in the field of viewing, the solid-state imaging apparatus 50 (55) of the first or second embodiment can be used for, for example, an apparatus for capturing an image to be viewed, such as a digital camera, a smartphone, and a mobile phone with a camera function.

In the field of traffic, the solid-state imaging apparatus (55) of the first or second embodiment can be used for, for example, an apparatus used for traffic, such as an on-board sensor that captures images of the front, back, surroundings, inside of a car, or the like, a monitoring camera that monitors traveling vehicles or roads, and a distance measurement sensor that measures the distance between vehicles and the like, for safe drive like automatic stop or for recognizing the state of the driver and the like.

In the field of home appliance, the solid-state imaging apparatus 50 (55) of the first or second embodiment can be used for, for example, an apparatus used as a home appliance, such as a television receiver, a refrigerator, and an air conditioner, that captures an image of a gesture of the user to perform equipment operation according to the gesture.

In the field of medical and healthcare, the solid-state imaging apparatus 50 (55) of the first or second embodiment can be used for, for example, an apparatus used for medical or healthcare, such as an endoscope and an apparatus that captures images of blood vessels by receiving infrared light.

In the field of security, the solid-state imaging apparatus (55) of the first or second embodiment can be used for, for example, an apparatus used for security, such as a monitoring camera for crime prevention and a camera for personal authentication.

In the field of beauty, the solid-state imaging apparatus (55) of the first or second embodiment can be used for, for example, an apparatus used for beauty, such as a skin measurement device that captures images of the skin and a microscope that captures images of the scalp.

In the field of sports, the solid-state imaging apparatus (55) of the first or second embodiment can be used for, for example, an apparatus used for sports, such as an action camera and a wearable camera for sports and the like.

In the field of agriculture, the solid-state imaging apparatus 50 (55) of the first or second embodiment can be used for, for example, an apparatus used for agriculture, such as a camera that monitors the state of a farm or crop.

The present technology is applicable to a variety of products. An application example to an endoscopic surgery system is described below.

8. Application Example to Endoscopic Surgery System

The present technology can be applied to an endoscopic surgery system.

Figure 13:
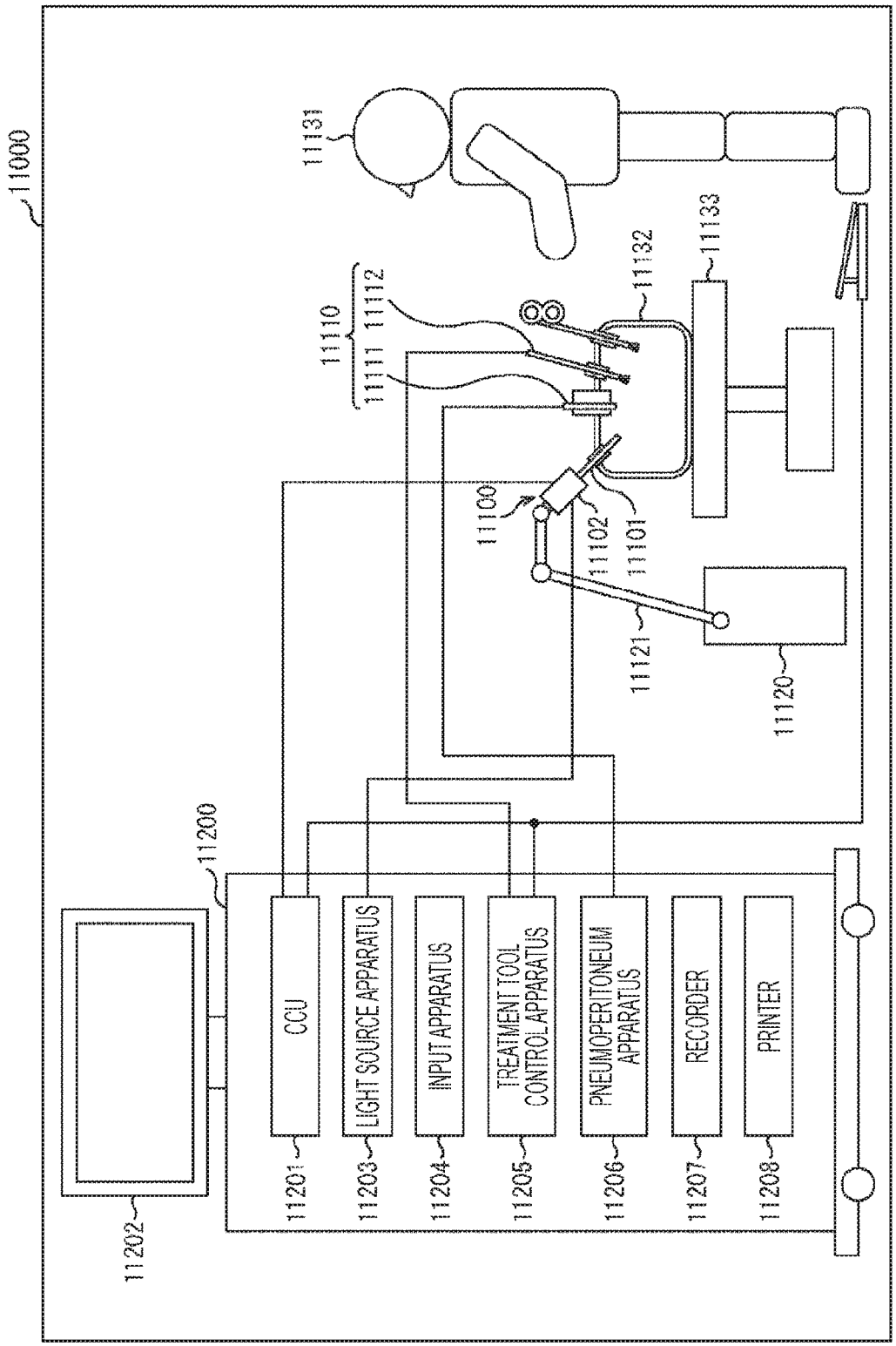
FIG. 13 is a diagram illustrating an example of a schematic configuration of an endoscopic surgery system.

FIG. 13 is a diagram illustrating an example of a schematic configuration of an endoscopic surgery system to which the present technology can be applied.

FIG. 13 illustrates a situation where an operator (doctor) 11131 is performing surgery on a patient 11132 on a patient bed 11133 using the endoscopic surgery system 11000. As illustrated, the endoscopic surgery system 11000 includes an endoscope 11100, other surgical tools 11110, e.g., a pneumoperitoneum tube 11111, an energy treatment tool 11112, or the like, a support arm apparatus 11120 supporting the endoscope 11100, and a cart 11200 on which various apparatuses for an endoscopic surgery are mounted.

The endoscope 11100 includes a lens tube 11101 in which a region with a predetermined length from a tip end, is inserted into the body cavity of the patient 11132, and a camera head 11102 connected to a base end of the lens tube 11101. In the illustrated example, the endoscope 11100 configured as a so-called rigid scope including a rigid lens tube 11101, is illustrated, but the endoscope 11100 may be configured as a so-called flexible scope including a flexible lens tube.

An opening portion into which an objective lens is fitted, is provided on the tip end of the lens tube 11101. A light source apparatus 11203 is connected to the endoscope 11100, and light generated by the light source apparatus 11203 is guided to the tip end of the lens tube by a light guide provided to extend in the lens tube 11101, and is emitted towards an observation target in the body cavity of the patient 11132 through the objective lens. Note that the endoscope 11100 may be a forward-viewing endoscope, or may be an oblique-viewing endoscope or a side-viewing endoscope.

In the camera head 11102, an optical system and an imaging element are provided, and reflection light (observation light) from the observation target, is condensed in the imaging element by the optical system. The observation light is subjected to the photoelectric conversion by the imaging element, and an electrical signal corresponding to the observation light, that is, an image signal corresponding to an observation image, is generated. The image signal is transmitted to a camera control unit (CCU) 11201, as RAW data.

The CCU 11201 includes a central processing unit (CPU), a graphics processing unit (GPU), or the like, and integrally controls the operation of the endoscope 11100 and the display apparatus 11202. Moreover, the CCU 11201 receives the image signal from the camera head 11102 and performs various image processing for displaying the image based on the image signal, for example, as development processing (demosaic processing) or the like, on the image signal.

The display apparatus 11202 displays an image based on the image signal subjected to the image processing by the CCU 11201 according to the control from the CCU 11201.

The light source apparatus 11203, for example, includes a light source such as a light emitting diode (LED), and supplies irradiation light at the time of capturing the surgical site or the like to the endoscope 11100.

The input apparatus 11204 is an input interface with respect to the endoscopic surgery system 11000. The user is capable of performing the input of various information items, or the input of an instruction with respect to endoscopic surgery system 11000, through the input apparatus 11204. For example, the user inputs an instruction or the like to change conditions of imaging (type of irradiation light, magnification, focal length, and the like) by the endoscope 11100.

The treatment tool control apparatus 11205 controls the driving of the energy treatment tool 11112 for the cauterization and the incision of the tissue, the sealing of the blood vessel, or the like. In order to ensure a visual field of the endoscope 11100 and to ensure a working space of the surgery operator, the pneumoperitoneum apparatus 11206 sends gas into the body cavity through the pneumoperitoneum tube 11111 such that the body cavity of the patient 11132 is inflated. The recorder 11207 is an apparatus capable of recording various information items associated with the surgery. The printer 11208 is an apparatus capable of printing various information items associated with the surgery, in various formats such as a text, an image, or a graph.

Note that the light source apparatus 11203 that supplies irradiation light in capturing the surgical site to the endoscope 11100 can be configured from, for example, a white light source configured by an LED, a laser light source, or a combination thereof. In a case where the white light source includes a combination of RGB laser light sources, it is possible to control an output intensity and an output timing of each color (each wavelength) with high accuracy, and thus, it is possible to adjust a white balance of the captured image with the light source apparatus 11203. Furthermore, in this case, laser light from each of the RGB laser light sources is emitted to the observation target in a time division manner, and the driving of the imaging element of the camera head 11102 is controlled in synchronization with the emission timing, and thus, it is also possible to capture an image corresponding to each of RGB in a time division manner. According to such a method, it is possible to obtain a color image without providing a color filter in the imaging element.

Furthermore, the driving of the light source apparatus 11203 may be controlled such that the intensity of the light to be output is changed for each predetermined time. The driving of the imaging element of the camera head 11102 is controlled in synchronization with a timing when the intensity of the light is changed, images are acquired in a time division manner, and the images are synthesized, and thus, it is possible to generate an image of a high dynamic range, without so-called black defects and overexposure.

Furthermore, the light source apparatus 11203 may be configured to supply light of a predetermined wavelength band corresponding to special light imaging. In the special light imaging, for example, light of a narrow band (i.e., white light) is applied, compared to irradiation light at the time of performing usual observation by using wavelength dependency of absorbing light in the body tissue, and thus, so-called narrow band imaging of capturing a predetermined tissue such as a blood vessel in a superficial portion of a mucous membrane with a high contrast, is performed. Alternatively, in the special light imaging, fluorescent light imaging of obtaining an image by fluorescent light generated by being irradiated with excited light, may be performed. In the fluorescent light imaging, for example, the body tissue is irradiated with the excited light, and the fluorescent light from the body tissue is observed (autofluorescent light imaging), or a reagent such as indocyanine green (ICG) is locally injected into the body tissue, and the body tissue is irradiated with excited light corresponding to a fluorescent light wavelength of the reagent, and thus, a fluorescent image is obtained. The light source apparatus 11203 can be configured to supply the narrow band light and/or the excited light corresponding to such special light imaging.

Figure 14:
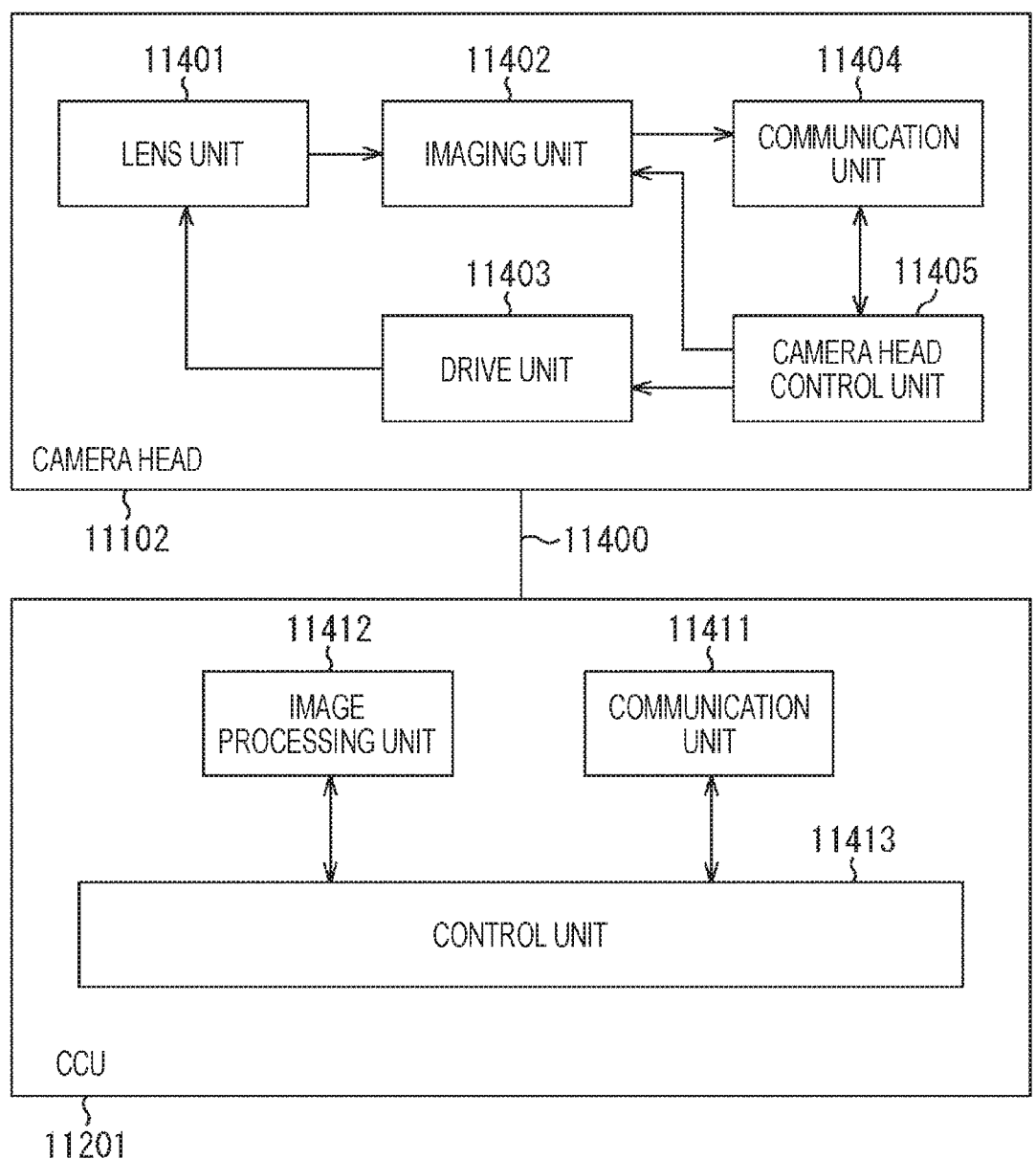
FIG. 14 is a block diagram illustrating an example of a function configuration of a camera head and a CCU.

FIG. 14 is a block diagram illustrating an example of a functional configuration of the camera head 11102 and the CCU 11201 illustrated in FIG. 13.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected to be capable of mutual communication through a transmission cable 11400.

The lens unit 11401 is an optical system provided in a connection portion with the lens tube 11101. Observation light incorporated from a tip end of the lens tube 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging element constituting the imaging unit 11402 may be one (so-called single plate type) or plural (so-called multi-plate type). In a case where the imaging unit 11402 is configured as a multi-plate type, for example, image signals each corresponding to RGB may be generated by each imaging element, and a color image may be obtained by combining them. Alternatively, the imaging unit 11402 may include a pair of imaging elements for respectively acquiring right-eye and left-eye image signals corresponding to 3D (dimensional) display. The 3D display is performed, and thus, the surgery operator 11131 is capable of more accurately grasping the depth of the biological tissue in the surgery portion. Note that, in a case where configuration of the imaging unit 11402 is of a multi-plate type, a plurality of lens units 11401 may be provided corresponding to each of the imaging elements.

Furthermore, the imaging unit 11402 may not be necessarily provided in the camera head 11102. For example, the imaging unit 11402 may be provided immediately after the objective lens, in the lens tube 11101.

The drive unit 11403 includes an actuator, and moves the zoom lens and the focus lens of the lens unit 11401 along the optical axis by a predetermined distance, according to the control from the camera head control unit 11405. Therefore, it is possible to suitably adjust the magnification and the focal point of the image captured by the imaging unit 11402.

The communication unit 11404 includes a communication apparatus for transmitting and receiving various information items with respect to the CCU 11201. The communication unit 11404 transmits the image signal obtained from the imaging unit 11402 to the CCU 11201 through the transmission cable 11400, as the RAW data.

Furthermore, the communication unit 11404 receives a control signal for controlling the driving of the camera head 11102 from the CCU 11201 and supplies the control signal to the camera head control unit 11405. The control signal, for example, includes information associated with the imaging condition, such as information of designating a frame rate of the captured image, information of designating an exposure value at the time of the imaging, and/or information of designating the magnification and the focal point of the imaged image.

Note that the imaging conditions such as the frame rate, exposure value, magnification, and focal point described above may be appropriately designated by the user, or may be automatically set by the control unit 11413 of the CCU 11201 on the basis of the acquired image signal. In the latter case, a so-called auto exposure (AE) function, an auto focus (AF) function, and an auto white balance (AWB) function are provided in the endoscope 11100.

The camera head control unit 11405 controls the driving of the camera head 11102 on the basis of the control signal from the CCU 11201 received through the communication unit 11404.

The communication unit 11411 includes a communication apparatus for transmitting and receiving various information items with respect to the camera head 11102. The communication unit 11411 receives the image signal to be transmitted from the camera head 11102, through the transmission cable 11400.

Furthermore, the communication unit 11411 transmits the control signal for controlling the driving of the camera head 11102 to the camera head 11102. The image signal and the control signal can be transmitted by electrical communication, optical communication, or the like.

The image processing unit 11412 performs various image processing on the image signal which is the RAW data transmitted from the camera head 11102.

The control unit 11413 performs various types of control related to imaging of the surgical site or the like by the endoscope 11100 and display of a captured image obtained by imaging of the surgical site or the like. For example, the control unit 11413 generates the control signal for controlling the driving of the camera head 11102.

Furthermore, the control unit 11413 causes the display apparatus 11202 to display the captured image of the surgery site or the like on the basis of the image signal subjected to the image processing by the image processing unit 11412. At this time, the control unit 11413 may recognize various objects in the captured image by using various image recognition technologies. For example, the control unit 11413 detects the shape, the color, or the like of the edge of the object included in the captured image, and thus, it is possible to recognize a surgical tool such as forceps, a specific biological portion, bleed, mist at the time of using the energy treatment tool 11112, and the like When the captured image is displayed on the display apparatus 11202, the control unit 11413 may display various surgery support information items to be superimposed on the image of the surgery site, by using a recognition result. Surgery support information is displayed in a superimposed manner and presented to the operator 11131, thereby reducing the burden on the operator 11131 and allowing the operator 11131 to proceed with surgery reliably.

The transmission cable 11400 connecting the camera head 11102 and the CCU 11201 is an electrical signal cable corresponding to the communication of the electrical signal, an optical fiber corresponding to the optical communication, or a composite cable thereof.

Here, in the illustrated example, the communication is performed in a wired manner, by using the transmission cable 11400, but the communication between the camera head 11102 and the CCU 11201 may be performed in a wireless manner.

An example of the endoscopic surgery system to which the present technology can be applied has been described. The present technology can be applied to the imaging unit 11402 of the camera head 11102 among the configurations described above. Specifically, the solid-state imaging apparatus according to the present technology can be applied to the imaging unit 11402. By applying the present technology to the imaging unit 11402, a clearer operative image can be obtained, so that the operator can reliably confirm the surgical site.

Note that, here, although an endoscopic surgery system has been described as an example, the present technology may be applied to, for example, a capsule endoscopic system and the like.

Furthermore, the first to fifth embodiments according to the present technology are not limited to the aforementioned embodiments, but various changes may be made within the scope not departing from the gist of the present technology.

Furthermore, the effects described in the present description are merely illustrative and are not limitative, and other effects may be provided.

Furthermore, the present technology may adopt the configuration described below.

(1) A solid-state imaging apparatus including:

a first sensor; a first semiconductor substrate having a memory; a second semiconductor substrate having a logic circuit; and a second sensor, in which the first sensor, the first semiconductor substrate, the second semiconductor substrate, and the second sensor are arranged in this order.

(2) The solid-state imaging apparatus according to (1), in which an electrode of a first wiring layer formed on a front surface side of the first semiconductor substrate and an electrode of a second wiring layer formed on a front surface side of the second semiconductor substrate are bonded so as to face each other and are electrically connected.

(3) The solid-state imaging apparatus according to (1) or (2), in which the second semiconductor substrate is electrically connected to each of the first sensor and the second sensor.

(4) The solid-state imaging apparatus according to any one of (1) to (3), in which the second semiconductor substrate is connected to each of the first semiconductor substrate and the second sensor by a copper wiring.

(5) The solid-state imaging apparatus according to any one of (1) to (4), in which the second semiconductor substrate is connected to the first sensor by a through via penetrating the first semiconductor substrate.

(6) The solid-state imaging apparatus according to any one of (1) to (5), in which the logic circuit controls data written onto the memory from the first sensor and the second sensor or data read from the memory.

(7) The solid-state imaging apparatus according to any one of (1) to (6), in which the logic circuit controls a timing of writing data onto the memory from the first sensor and the second sensor or a timing of reading data from the memory.

(8) The solid-state imaging apparatus according to any one of (1) to (7), in which
the memory includes a DRAM.
(9) The solid-state imaging apparatus according to any one of (1) to (7), in which
the memory includes an SRAM.
(10) The solid-state imaging apparatus according to any one of (1) to (9), in which
the first sensor and the second sensor include a color filter, an on-semiconductor chip lens, and a photoelectric conversion unit.
(11) The solid-state imaging apparatus according to (10), in which
the color filter and the on-semiconductor chip lens are provided on a back surface side of the photoelectric conversion unit.
(12) The solid-state imaging apparatus according to any one of (1) to (11), further including:
a flexible printed substrate; and a cover glass.
(13) A method for manufacturing a solid-state imaging apparatus, the method including:
bonding a first electrode formed on one surface of a first semiconductor substrate having a memory and a second electrode formed on one surface of a second semiconductor substrate having a logic circuit such that the first electrode and the second electrode face each other;
after the bonding, stacking a second sensor on another surface not bonded to the second semiconductor substrate; and
after stacking the second sensor, stacking a first sensor on another surface not bonded to the first semiconductor substrate.
(14) A method for manufacturing a solid-state imaging apparatus, the method including:
stacking a first sensor on one surface of a first semiconductor substrate having a memory;
stacking a second sensor on one surface of a second semiconductor substrate having a logic circuit; and
after stacking the respective first sensor and the second sensor, bonding a first electrode formed on another surface not bonded to the first semiconductor substrate and a second electrode formed on another surface not bonded to the second semiconductor substrate such that the first electrode and the second electrode face each other.
(15) Electronic equipment including the solid-state imaging apparatus according to any one of (1) to (12).

REFERENCE SIGNS LIST

10 First sensor
10-1 First A/D converter
10-2 First memory
11 First color filter
12 First on-semiconductor chip lens
13 First photoelectric conversion unit
17 First sensor wiring layer
18 Third semiconductor substrate
18a Front surface side
19 Pad
20 First semiconductor substrate
21 Memory
22 First wiring layer
23 Electrode
30 Second semiconductor substrate
31 Logic circuit
32 Second wiring layer
33 Electrode
40 Second sensor
40-1 Second A/D converter
40-2 Second memory
41 Second color filter
42 Second on-semiconductor chip lens
43 Second photoelectric conversion unit
47 Fourth sensor wiring layer
48a Glass
48b Wafer support system
49 Fourth semiconductor substrate
49a Front surface side
50, 55 Solid-state imaging apparatus
60 Flexible printed substrate
70 Cover glass

The invention claimed is:

1. A solid-state imaging apparatus, comprising:
a first sensor; a first semiconductor substrate having a memory; a second semiconductor substrate having a logic circuit; and a second sensor, wherein
the first sensor, the first semiconductor substrate, the second semiconductor substrate, and the second sensor are arranged in this order.

2. The solid-state imaging apparatus according to claim 1, wherein
an electrode of a first wiring layer formed on a front surface side of the first semiconductor substrate and an electrode of a second wiring layer formed on a front surface side of the second semiconductor substrate are bonded so as to face each other and are electrically connected.

3. The solid-state imaging apparatus according to claim 1, wherein
the second semiconductor substrate is electrically connected to each of the first sensor and the second sensor.

4. The solid-state imaging apparatus according to claim 1, wherein
the second semiconductor substrate is connected to each of the first semiconductor substrate and the second sensor by a copper wiring.

5. The solid-state imaging apparatus according to claim 1, wherein
the second semiconductor substrate is connected to the first sensor by a through via penetrating the first semiconductor substrate.

6. The solid-state imaging apparatus according to claim 1, wherein
the logic circuit controls data written onto the memory from the first sensor and the second sensor or data read from the memory.

7. The solid-state imaging apparatus according to claim 1, wherein
the logic circuit controls a timing of writing data onto the memory from the first sensor and the second sensor or a timing of reading data from the memory.

8. The solid-state imaging apparatus according to claim 1, wherein
the memory includes a dynamic random access memory (DRAM).

9. The solid-state imaging apparatus according to claim 1, wherein
the memory includes static random access memory (SRAM).

10. The solid-state imaging apparatus according to claim 1, wherein
the first sensor and the second sensor include a color filter, an on-semiconductor chip lens, and a photoelectric conversion unit.

11. The solid-state imaging apparatus according to claim 10, wherein
the color filter and the on-semiconductor chip lens are provided on a back surface side of the photoelectric conversion unit.

12. The solid-state imaging apparatus according to claim 1, further comprising:
a flexible printed substrate; and a cover glass.

13. An electronic equipment, comprising the solid-state imaging apparatus according to claim 1.

14. A method for manufacturing a solid-state imaging apparatus, the method comprising:
bonding a first electrode formed on one surface of a first semiconductor substrate having a memory and a second electrode formed on one surface of a second semiconductor substrate having a logic circuit such that the first electrode and the second electrode face each other;
after the bonding, stacking a second sensor on another surface not bonded to the second semiconductor substrate; and
after stacking the second sensor, stacking a first sensor on another surface not bonded to the first semiconductor substrate.

15. A method for manufacturing a solid-state imaging apparatus, the method comprising:
stacking a first sensor on one surface of a first semiconductor substrate having a memory;
stacking a second sensor on one surface of a second semiconductor substrate having a logic circuit; and
after stacking the respective first sensor and the second sensor, bonding a first electrode formed on another surface not bonded to the first semiconductor substrate and a second electrode formed on another surface not bonded to the second semiconductor substrate such that the first electrode and the second electrode face each other.

* * * * *